(12) United States Patent
Nakatsuka et al.

(10) Patent No.: US 10,020,040 B2
(45) Date of Patent: Jul. 10, 2018

(54) SEMICONDUCTOR MEMORY DEVICE

(71) Applicant: TOSHIBA MEMORY CORPORATION, Minato-ku, Tokyo (JP)

(72) Inventors: Keisuke Nakatsuka, Seoul (KR); Tsuneo Inaba, Kamakura Kanagawa (JP); Yutaka Shirai, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/455,906

(22) Filed: Mar. 10, 2017

(65) Prior Publication Data

US 2018/0075892 A1 Mar. 15, 2018

Related U.S. Application Data

(60) Provisional application No. 62/394,143, filed on Sep. 13, 2016.

(51) Int. Cl.
| | |
|---|---|
| *G11C 16/28* | (2006.01) |
| *G11C 11/16* | (2006.01) |
| G11C 16/26 | (2006.01) |
| G11C 11/56 | (2006.01) |

(52) U.S. Cl.
CPC ...... *G11C 11/1673* (2013.01); *G11C 11/1655* (2013.01); *G11C 11/1657* (2013.01); *G11C 11/1675* (2013.01); *G11C 11/5642* (2013.01); *G11C 16/26* (2013.01); *G11C 16/28* (2013.01)

(58) Field of Classification Search
CPC ...... G11C 16/28; G11C 16/26; G11C 11/5642
USPC ............... 365/185.21, 196, 205, 207
See application file for complete search history.

(56) References Cited

U.S. PATENT DOCUMENTS

| | | | |
|---|---|---|---|
| 2011/0188305 A1 | 8/2011 | Yang | |
| 2012/0155157 A1 | 6/2012 | Oh | |
| 2013/0155761 A1 | 6/2013 | Aoki | |
| 2016/0049186 A1* | 2/2016 | Takizawa | ............ G11C 11/1673 365/158 |

FOREIGN PATENT DOCUMENTS

| | | |
|---|---|---|
| JP | 2008217842 A | 9/2008 |
| JP | 2012133857 A | 7/2012 |
| JP | 2013125565 A | 6/2013 |
| JP | 2013532344 A | 8/2013 |
| JP | 2016066392 A | 4/2016 |

* cited by examiner

*Primary Examiner* — Jason Lappas
(74) *Attorney, Agent, or Firm* — Holtz, Holtz & Volek PC

(57) ABSTRACT

According to one embodiment, a semiconductor memory device comprises: first to fourth memory cells, each of which is configured to have a first resistance state or a second resistance state; and a first circuit configured to output first data based on a first signal representing a resistance state of the first memory cell and a second signal representing a resistance state of the second memory cell, output second data based on the second signal and a third signal representing a resistance state of the third memory cell, and output third data based on the third signal and a fourth signal representing a resistance state of the fourth memory cell.

20 Claims, 18 Drawing Sheets

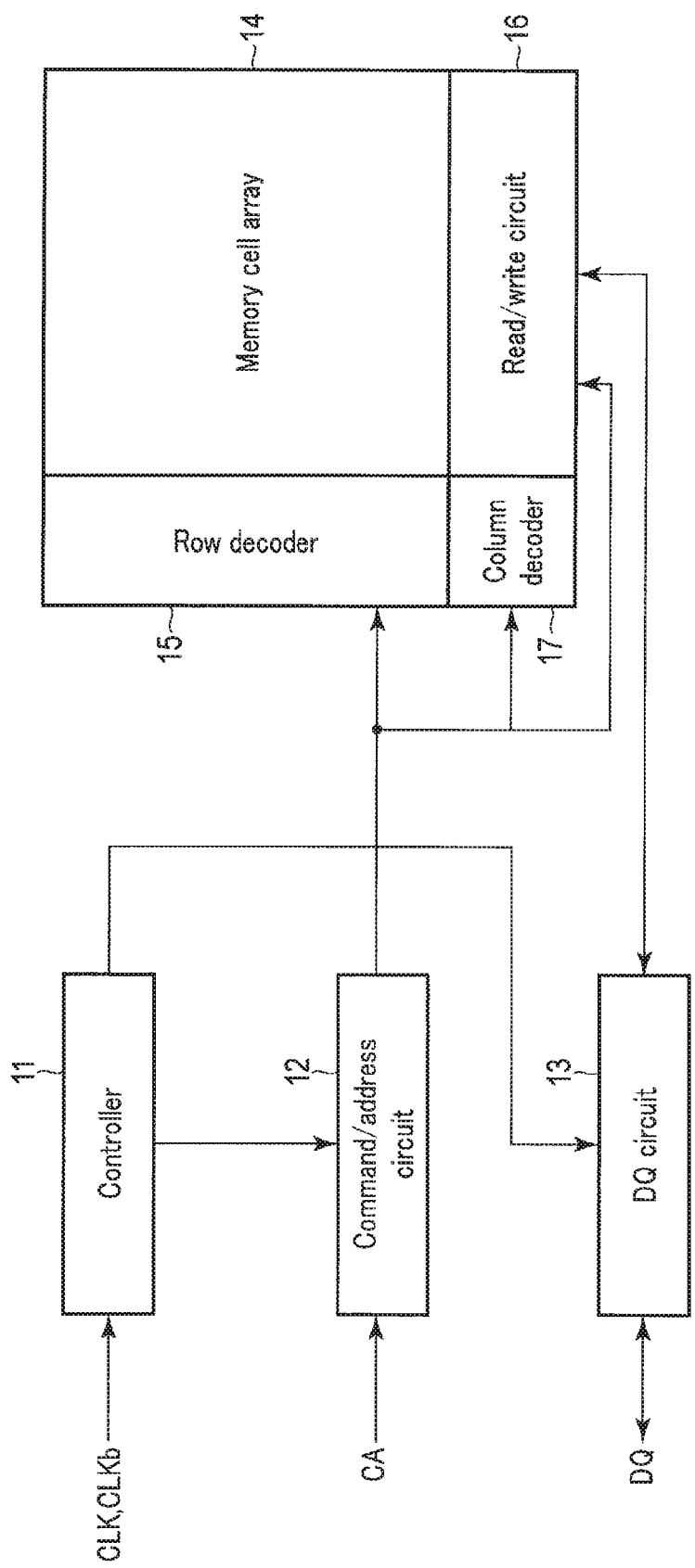
F I G. 1

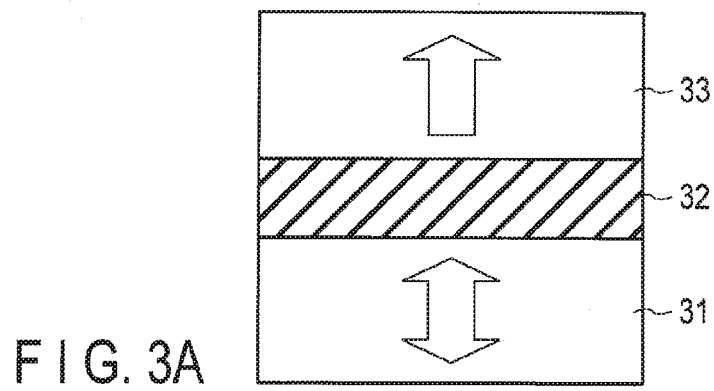
FIG. 3A
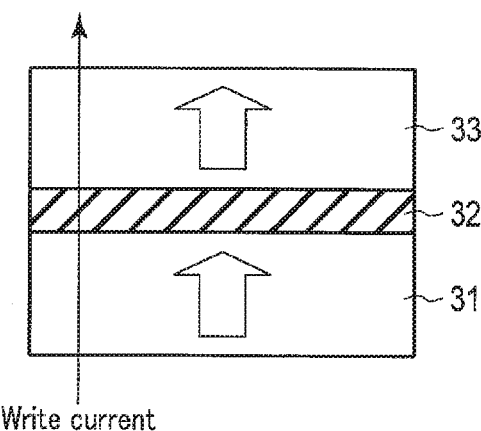
FIG. 3B    Parallel state (low resistance)
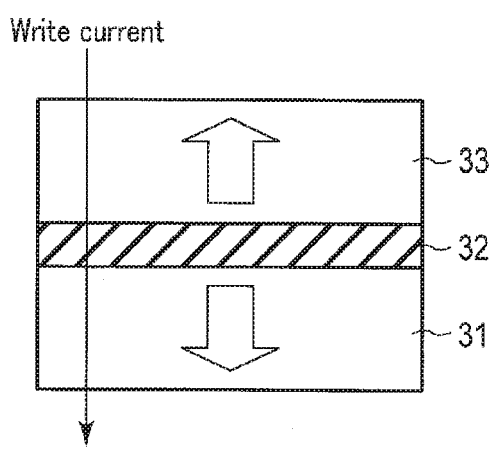
FIG. 3C    Anti-parallel state (high resistance)

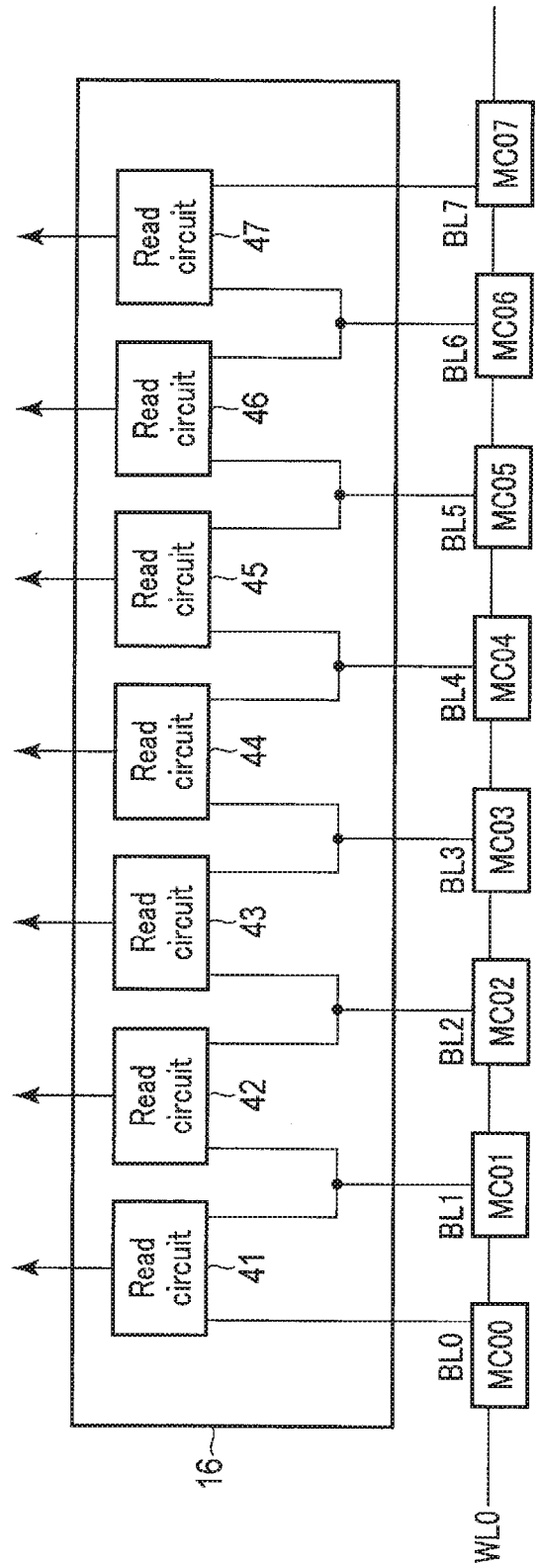
F I G. 4

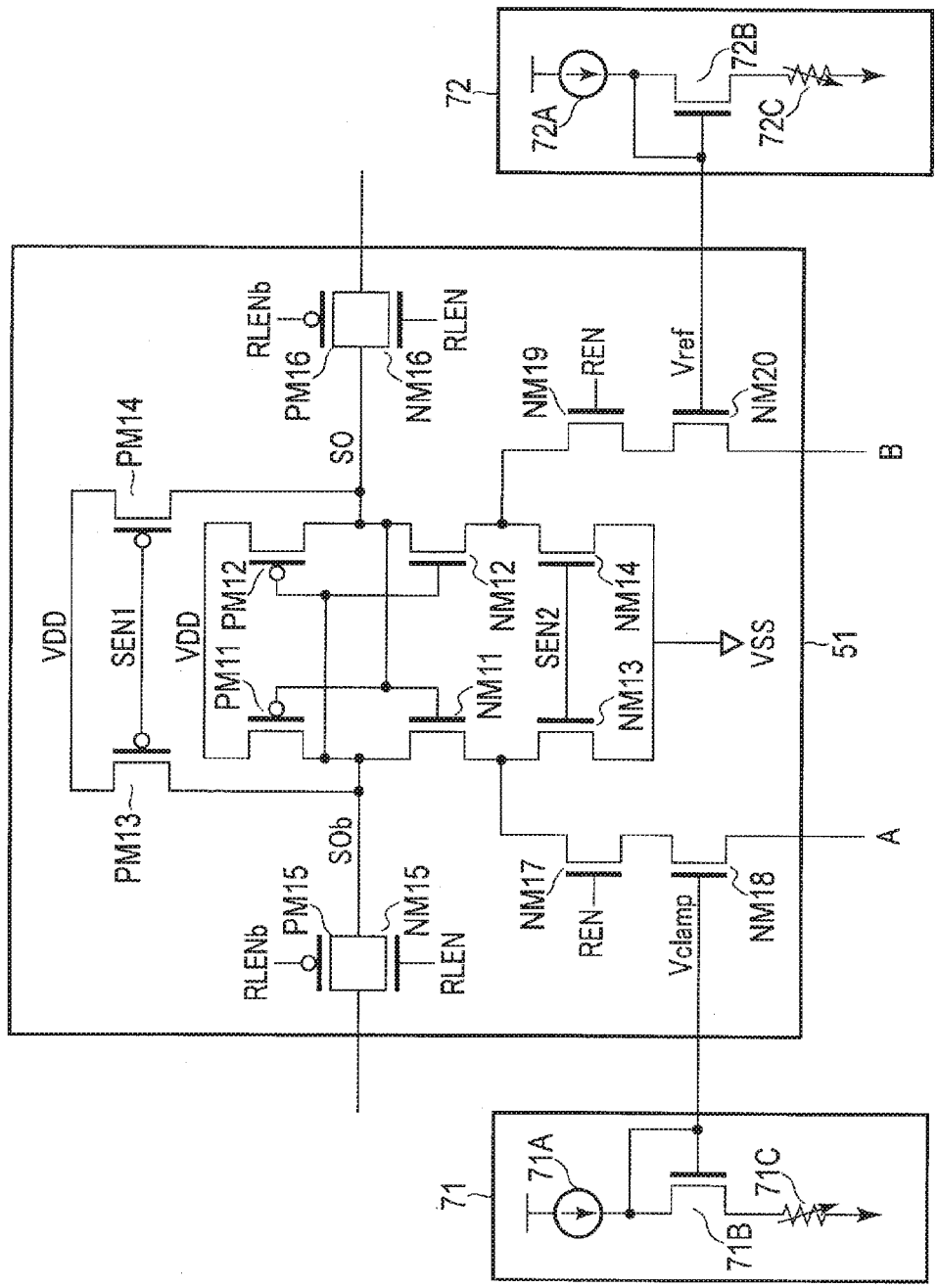
F I G. 6

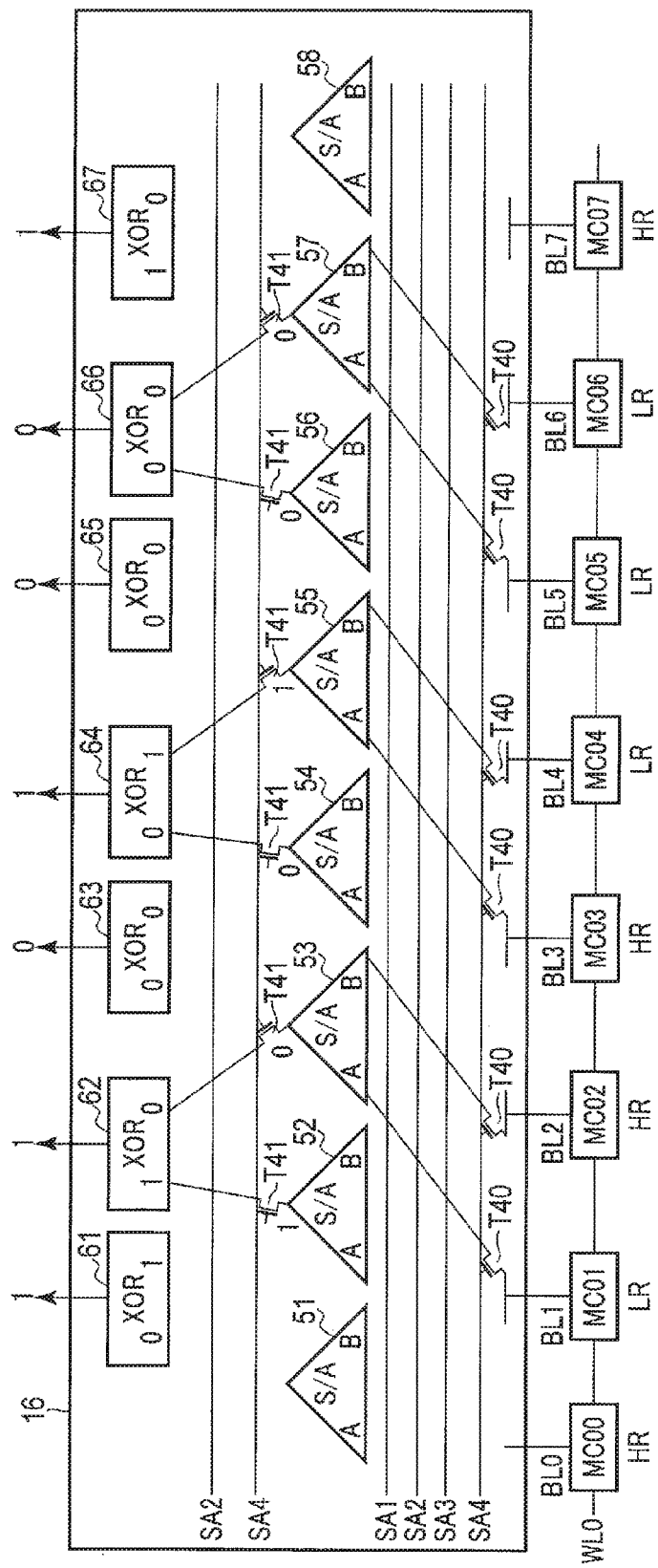
F I G. 11

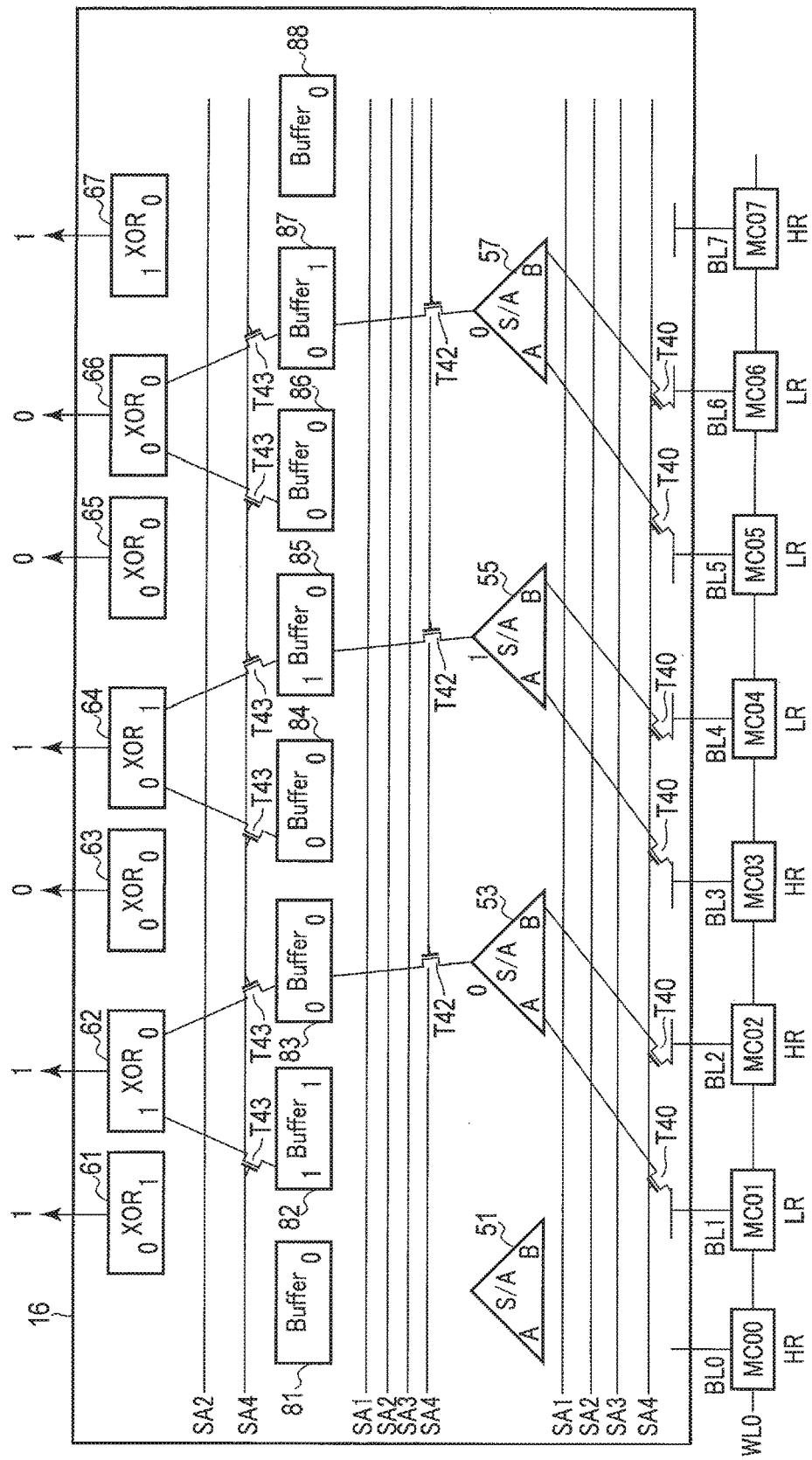
F I G. 17

SEMICONDUCTOR MEMORY DEVICE

CROSS REFERENCE TO RELATED APPLICATIONS

This application is based upon and claims the benefit of priority from U.S. Provisional Application No. 62/394,143, filed Sep. 13, 2016, the entire contents of all of which are incorporated herein by reference.

FIELD

Embodiments described herein relate generally to a semiconductor memory device.

BACKGROUND

Magnetic Random Access Memory (MRAM) uses a memory element having a magneto-resistance effect as a memory cell. MRAM receives attention as a next-generation memory characterized by high-speed operations, large capacities, and nonvolatility.

BRIEF DESCRIPTION OF THE DRAWINGS

FIG. 1 is a block diagram showing an overall configuration of a semiconductor memory device according to a first embodiment;

FIG. 3A is a sectional view showing an outline configuration of a variable resistive element in the semiconductor memory device according to the first embodiment;

FIG. 3B is a diagram illustrating writing into the variable resistive element in the semiconductor memory device according to the first embodiment and a diagram showing a sectional view of the variable resistive element in a P state;

FIG. 3C is a diagram illustrating writing into the variable resistive element in the semiconductor memory device according to the first embodiment and a diagram showing a sectional view of the variable resistive element in an AP state;

FIG. 4 is a block diagram showing a read/write circuit in the semiconductor memory device according to the first embodiment;

FIG. 6 is a circuit diagram showing a sense amplifier in the semiconductor memory device according to the first embodiment;

FIG. 11 is a diagram showing connection relations of the read/write circuit at times t25 to t37 in FIG. 7;

FIG. 17 is a diagram showing connection relations of the read/write circuit at times t27 to t37 in FIG. 13.

DETAILED DESCRIPTION

Figure 2:
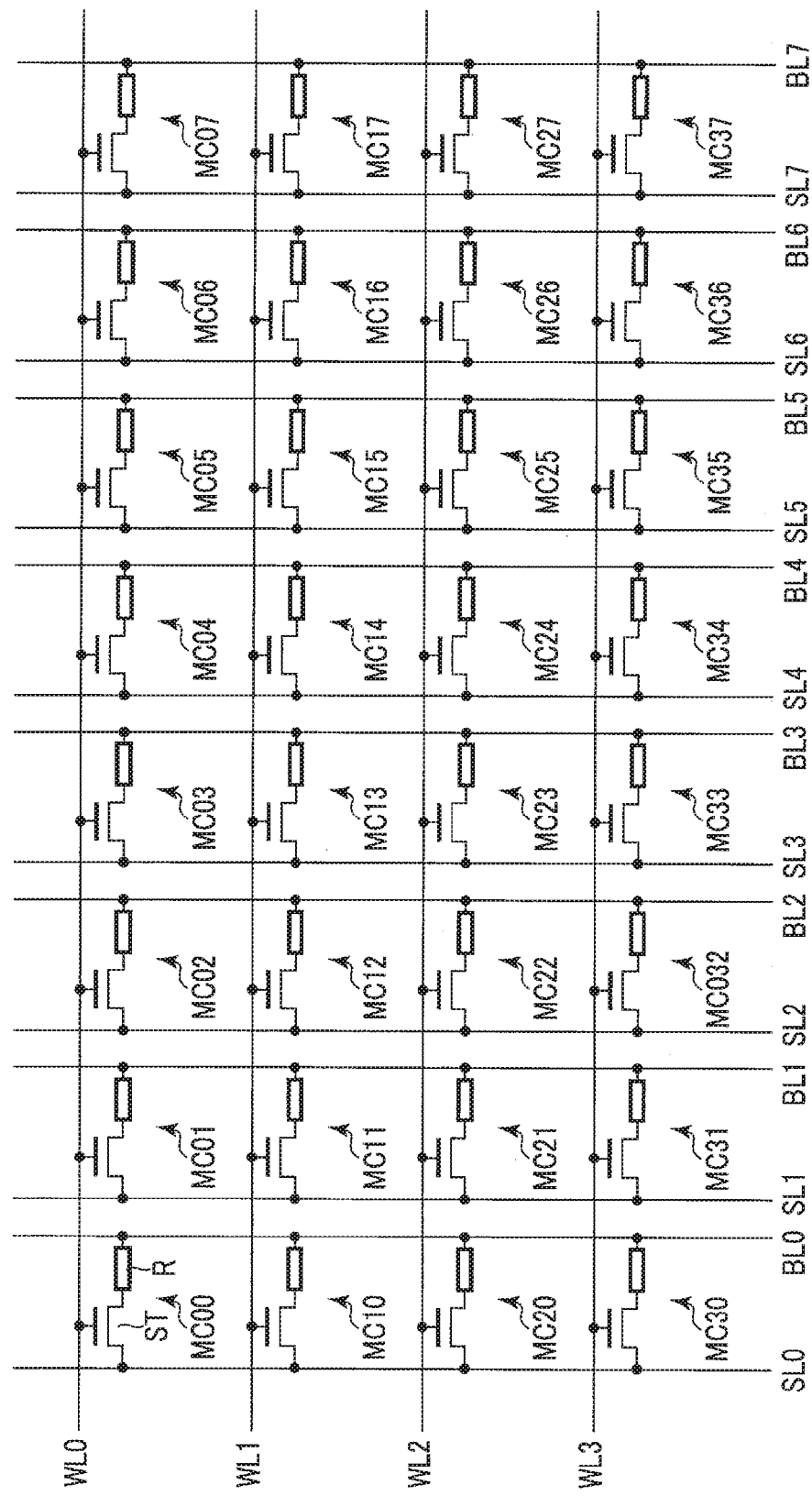
FIG. 2 is a diagram showing a memory cell array of the semiconductor memory device according to the first embodiment.

In general, according to one embodiment, a semiconductor memory device comprises: first to fourth memory cells, each of which is configured to have a first resistance state or a second resistance state; and a first circuit configured to output first data based on a first signal representing a resistance state of the first memory cell and a second signal representing a resistance state of the second memory cell, output second data based on the second signal and a third signal representing a resistance state of the third memory cell, and output third data based on the third signal and a fourth signal representing a resistance state of the fourth memory cell.

The present embodiment will be described below with reference to drawings. In the drawings, the same reference numerals are attached to the same portions.

First Embodiment

Hereinafter, a semiconductor memory device according to the first embodiment will be described using FIGS. 1, 2, 3, 4, 5, 6, 7, 8, 9, 10, and 11.

Here, the semiconductor memory device will be described by taking, as a variable resistive element, MRAM that stores data using a magnetic tunnel junction (MTJ) element as an example, but the variable resistive element is not limited to the above example. The present embodiment is applicable to memories in general that senses a resistance difference between variable resistive elements by converting the resistance difference into a current difference or a voltage difference. As such a memory, for example, MRAM, Dynamic Random Access Memory (DRAM), Resistive Random Access Memory (ReRAM), and Phase Change Random Access Memory (PCRAM) can be cited.

In the description that follows, if not specifically mentioned, "connection (coupling)" includes not only coupling directly, but also coupling via any element.

A first terminal of a transistor indicates one of a source and a drain and a second terminal indicates the other of the source and the drain. A control terminal of a transistor indicates a gate.

An on state of a transistor indicates digitally being turned on. Digitally being turned on indicates a state in which a transistor can transfer any voltage. On the other hand, being turned on in an analog manner indicates a state in which a transistor can transfer up to a predetermined voltage.

[Configuration in the First Embodiment]

FIG. 1 is a block diagram showing an overall configuration of a semiconductor memory device according to the first embodiment.

As shown in FIG. 1, the semiconductor memory device includes a controller 11, a command/address circuit 12, a data circuit 13, a memory cell array 14, a row decoder 15, a read/write circuit 16, and a column decoder 17.

The controller 11 receives clock signals CLK, CLKb and an external control signal from outside (host device). The controller 11 includes an element such as a voltage generator and controls the command/address circuit 12 and the data circuit 13 based on a control signal from outside.

The command/address circuit 12 receives command/address signals CA from outside and supplies signals based on the received signals to the row decoder 15, the read/write circuit 16, and the column decoder 17.

The data circuit 13 transmits and receives data DQ between the outside and the read/write circuit 16. More specifically, the data circuit 13 transfers write data from outside to the read/write circuit 16. Also, the data circuit 13 transfers read data from the read/write circuit 16 to the outside.

The row decoder 15 selects a word line WL in accordance with a row address from the command/address circuit 12. The column decoder 17 selects a bit line BL and a source line SL in accordance with a column address from the command/address circuit 12. The read/write circuit 16 controls writing into the memory cell array 14 and reading from the memory cell array 14. Details of the read/write circuit 16 will be described below.

FIG. 2 is a diagram showing the memory cell array 14 of the semiconductor memory device according to the first embodiment.

As shown in FIG. 2, bit lines BL (BL0-BL7), source lines SL (SL0-SL3), and word lines WL (WL0-WL3) are provided in the memory cell array 14. The bit line BL and the source line SL extend in a first direction and are alternately provided in a second direction perpendicular to the first direction. The word line WL extends in the second direction. The memory cell array 10 has a plurality of memory cells MC (MC00-MC07, MC10-MC17, MC20-MC27, MC30-MC37). Each memory cell MC is provided in intersection positions of the bit line BL and the source line SL, and the word line WL. Thus, a plurality of memory cells MC is arranged in a matrix form in the first direction and the second direction.

More specifically, the memory cells MC00-MC07 are provided in intersection positions of the bit lines BL0-BL7 and the source lines SL0-SL7, and the word line WL0. Also, the memory cells MC10-MC17 are provided in intersection positions of the bit lines BL0-BL7 and the source lines SL0-SL7, and the word line WL1. The memory cells MC20-MC27 are provided in intersection positions of the bit lines BL0-BL7 and the source lines SL0-SL7, and the word line WL2. The memory cells MC30-MC37 are provided in intersection positions of the bit lines BL0-BL7 and the source lines SL0-SL7, and the word line WL3. The memory cell MC is electrically coupled to the bit line BL, the source line SL, and the word line WL in the intersection positions.

Incidentally, the numbers of the bit lines BL, the source lines SL, and the word lines WL of the memory cell array 14 are only examples and are not limited to the above examples.

The memory cell MC includes, for example, a variable resistive element R and a select transistor ST. One end of the variable resistive element R is electrically coupled to the bit line BL and the other end thereof is electrically coupled to a first terminal of the select transistor ST. A second terminal of the select transistor ST is electrically coupled to the source line SL and a control terminal of the select transistor ST is electrically coupled to the word line WL.

The resistance of the variable resistive element R is changed by applying a current (or a voltage) thereto. The variable resistive element R includes, for example, an MTJ element, a phase change element, a ferroelectric element or the like. The memory cell MC is selected by the select transistor ST being turned on by the word line WL. Here, a case in which MRAM, that is, the variable resistive element R is an MTJ element will be described.

FIG. 3A is a sectional view showing an outline configuration of the variable resistive element R in the semiconductor memory device according to the first embodiment. Here, as the variable resistive element R, a memory layer 31, a tunnel barrier layer 32, and a reference layer 33 are mainly shown.

As shown in FIG. 3A, the variable resistive element R includes a laminated body formed of the memory layer 31 as a ferromagnetic layer, the reference layer 33 as a ferromagnetic layer, and the tunnel barrier layer 32 as a non-magnetic layer formed therebetween.

The memory layer 31 is a ferromagnetic layer whose magnetization direction is variable and has vertical magnetic anisotropy perpendicular or approximately perpendicular to the film surface (top surface/bottom surface). Here, that the magnetization direction is variable indicates that the magnetization direction changes with respect to a predetermined write current.

Approximately perpendicular means that the direction of residual magnetization is within the range of $45° < \theta \leq 90°$ with respect to the film surface. The memory layer 31 is formed of, for example, cobalt-iron-boron (CoFeB) or iron boride (FeB).

The tunnel barrier layer 32 is formed on the memory layer 31. The tunnel barrier layer 32 is, for example, a non-magnetic layer and is formed of MgO.

The reference layer 33 is formed on the tunnel barrier layer 32. The reference layer 33 is a ferromagnetic layer whose magnetization direction is invariable and has vertical magnetic anisotropy perpendicular or approximately perpendicular to the film surface. Here, that the magnetization direction is invariable indicates that the magnetization direction does not change with respect to a predetermined write current. That is, the reference layer 33 has a larger energy barrier for reversing the magnetization direction than the memory layer 31. The reference layer 33 is formed of, for example, cobalt-platinum (CoPt), cobalt-nickel (CoNi), or cobalt-palladium (CoPd).

FIG. 3B is a diagram illustrating writing into the variable resistive element R in the semiconductor memory device according to the first embodiment and a diagram showing a sectional view of the variable resistive element in a parallel state (P state). FIG. 3C is a diagram illustrating writing into the variable resistive element R in the semiconductor memory device according to the first embodiment and a diagram showing a sectional view of the variable resistive element in an anti-parallel state (AP state).

The variable resistive element R is, for example, a spin injection type variable resistive element. Thus, when writing data into the variable resistive element R or reading data from the variable resistive element R, a current is bidirectionally passed in a direction perpendicular to the film surface the variable resistive element R.

More specifically, data is written into the variable resistive element R as described below.

When, as shown in FIG. 3B, a write current flows from the memory layer 31 to the reference layer 33, that is, electrons from the reference layer 33 toward the memory layer 31 are supplied, electrons spin-polarized in the same direction as the magnetization direction of the reference layer 33 are injected into the memory layer 31. In this case, the magnetization direction of the memory layer 31 is aligned to the same direction as the magnetization direction of the reference layer 33. Accordingly, the magnetization direction of the reference layer 33 and the magnetization direction of the memory layer 31 are parallel-arranged. In this parallel state, the variable resistive element R enters a low-resistance state (LR).

When, as shown in FIG. 3C, a write current flows from the reference layer 33 to the memory layer 31, that is, electrons from the memory layer 31 toward the reference layer 33 are supplied, on the other hand, electrons spin-polarized in the direction opposite to the magnetization direction of the reference layer 33 are injected into the memory layer 31 by being reflected by the reference layer 33. In this case, the magnetization direction of the memory layer 31 is aligned to the direction opposite to the magnetization direction of the reference layer 33. Accordingly, the magnetization direction of the reference layer 33 and the magnetization direction of the memory layer 31 are anti-parallel-arranged. In this anti-parallel state, the variable resistive element R enters a high-resistance state (HR).

Also, data is read from the variable resistive element R as described below.

A read current is supplied to the variable resistive element R. The read current is set to a value so that the magnetization direction of the memory layer 31 is not reversed (value smaller than the write current). By detecting a change of the resistance value of the variable resistive element R at this point, data can be read.

FIG. 4 is a block diagram showing the read/write circuit 16 in the semiconductor memory device according to the first embodiment.

As shown in FIG. 4, the read/write circuit 16 includes read circuits 41-47. The read circuits 41-47 read data in units of page. Here, "page" shows the unit of reading by a sense amplifier group included in the read circuits 41-47 and is made of a set of memory cells MC coupled to one word line WL in common. That is, the set of memory cells MC has the same row address. In FIG. 4, an example in which data is read as data in units of page from the memory cells MC00-MC07 coupled to the word line WL0 in common is shown.

The read circuit 41 is electrically coupled to the memory cell MC00 via the bit line BL0 and electrically coupled to the memory cell MC01 via the bit line BL1. The read circuit 42 is electrically coupled to the memory cell MC01 via the bit line BL1 and electrically coupled to the memory cell MC02 via the bit line BL2. The read circuit 43 is electrically coupled to the memory cell MC02 via the bit line BL2 and electrically coupled to the memory cell MC03 via the bit line BL3. Similarly, the read circuit 44 is electrically coupled to the memory cells MC03, MC04 via the bit lines BL3, BL4, the read circuit 45 is electrically coupled to the memory cells MC04, MC05 via the bit lines BL4, BL5, the read circuit 46 is electrically coupled to the memory cells MC05, MC06 via the bit lines BL5, BL6, and the read circuit 47 is electrically coupled to the memory cells MC06, MC07 via the bit lines BL6, BL7.

However, the number of memory cells in units of page and the number of read circuits are not limited to those of the above example. n read circuits are provided for (n+1) (n is an integer equal to 1 or greater) memory cells. Then, the n-th read circuit is electrically coupled to the n-th memory cell and the (n+1)-th memory cell.

Figure 5:
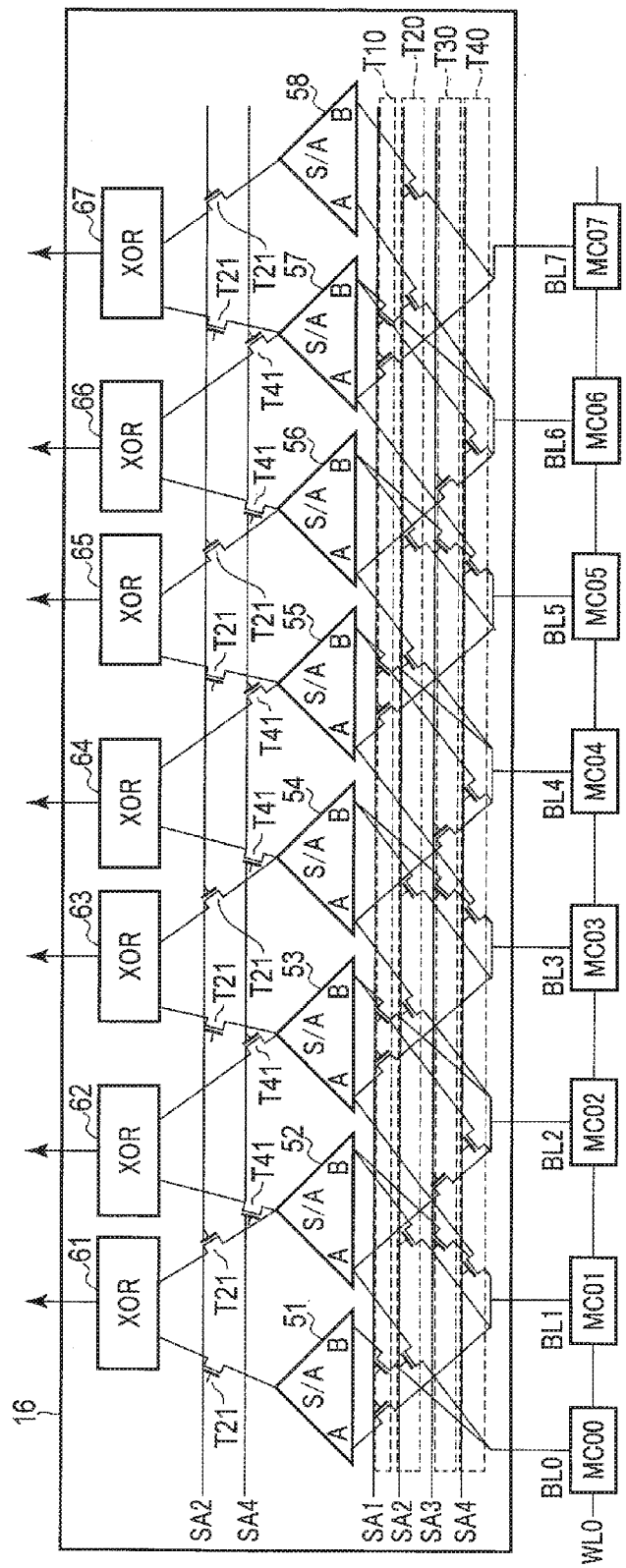
FIG. 5 is a block diagram showing the read/write circuit in the semiconductor memory device according to the first embodiment and a diagram showing read circuits in more detail.

FIG. 5 is a block diagram showing the read/write circuit 16 in the semiconductor memory device according to the first embodiment and a diagram showing the read circuits 41-47 in more detail.

As shown in FIG. 5, the read/write circuit 16 includes sense amplifiers 51-58, exclusive OR (XOR) circuits 61-67, and transistors T10, T20, T30, T40, T21, T41.

Here, the sense amplifiers 51, 52 and the XOR circuit 61 correspond to the read circuit 41, the sense amplifiers 52, 53 and the XOR circuit 62 correspond to the read circuit 42, and the sense amplifiers 53, 54 and the XOR circuit 63 correspond to the read circuit 43. Similarly, the sense amplifiers 54, 55 and the XOR circuit 64 correspond to the read circuit 44, the sense amplifiers 55, 56 and the XOR circuit 65 correspond to the read circuit 45, the sense amplifiers 56, 57 and the XOR circuit 66 correspond to the read circuit 46, and the sense amplifiers 57, 58 and the XOR circuit 67 correspond to the read circuit 47. That is, the sense amplifiers 52-57 are shared by neighboring read circuits.

Each of the sense amplifiers 51-58 has a first input terminal A and a second input terminal B.

The first input terminal A of the sense amplifier 51 is electrically coupled to the memory cell MC01 via the first terminal and the second terminal of the transistor T10 (hereinafter, simply referred to as "via a transistor"). The second input terminal B of the sense amplifier 51 is electrically coupled to the memory cell MC00 via the transistor T10. An output terminal of the sense amplifier 51 is electrically coupled to an input terminal of the XOR circuit 61 via the transistor T21.

The first input terminal A of the sense amplifier 52 is electrically coupled to the memory cell MC00 via the transistor T20 and further electrically coupled to the memory cell MC02 via the transistor T30. The second input terminal B of the sense amplifier 52 is electrically coupled to the memory cell MC01 via the transistor T20 and further electrically coupled to the memory cell MC01 via the transistor T30. The output terminal of the sense amplifier 52 is electrically coupled to the XOR circuit 61 via the transistor T21 and further electrically coupled to the input terminal of the XOR circuit 62 via the transistor T41.

The first input terminal A of the sense amplifier 53 is electrically coupled to the memory cell MC03 via the transistor T10 and further electrically coupled to the memory cell MC01 via the transistor T40. The second input terminal B of the sense amplifier 53 is electrically coupled to the memory cell MC02 via the transistor T10 and further electrically coupled to the memory cell MC02 via the transistor T40. The output terminal of the sense amplifier 53 is electrically coupled to the XOR circuit 63 via the transistor T11 and further electrically coupled to the input terminal of the XOR circuit 62 via the transistor T41.

The first input terminal A of the sense amplifier 54 is electrically coupled to the memory cell MC02 via the transistor T20 and further electrically coupled to the memory cell MC04 via the transistor T30. The second input terminal B of the sense amplifier 54 is electrically coupled to the memory cell MC03 via the transistor T20 and further electrically coupled to the memory cell MC03 via the transistor T30. The output terminal of the sense amplifier 54 is electrically coupled to the XOR circuit 63 via the transistor T21 and further electrically coupled to the input terminal of the XOR circuit 64 via the transistor T41.

The first input terminal A of the sense amplifier 55 is electrically coupled to the memory cell MC05 via the transistor T10 and further electrically coupled to the memory cell MC03 via the transistor T40. The second input terminal B of the sense amplifier 55 is electrically coupled to the memory cell MC04 via the transistor T10 and further electrically coupled to the memory cell MC04 via the transistor T40. The output terminal of the sense amplifier 55 is electrically coupled to the XOR circuit 65 via the transistor T11 and further electrically coupled to the input terminal of the XOR circuit 64 via the transistor T41.

The first input terminal A of the sense amplifier 56 is electrically coupled to the memory cell MC04 via the transistor T20 and further electrically coupled to the memory cell MC06 via the transistor T30. The second input terminal B of the sense amplifier 56 is electrically coupled to the memory cell MC05 via the transistor T20 and further electrically coupled to the memory cell MC05 via the transistor T30. The output terminal of the sense amplifier 56 is electrically coupled to the XOR circuit 65 via the transistor T21 and further electrically coupled to the input terminal of the XOR circuit 66 via the transistor T41.

The first input terminal A of the sense amplifier 57 is electrically coupled to the memory cell MC07 via the transistor T10 and further electrically coupled to the memory cell MC05 via the transistor T40. The second input terminal B of the sense amplifier 57 is electrically coupled to the memory cell MC06 via the transistor T10 and further electrically coupled to the memory cell MC06 via the transistor T40. The output terminal of the sense amplifier 57 is electrically coupled to the XOR circuit 67 via the transistor T11 and further electrically coupled to the input terminal of the XOR circuit 66 via the transistor T41.

The first input terminal A of the sense amplifier 58 is electrically coupled to the memory cell MC06 via the transistor T20. The second input terminal B of the sense amplifier 58 is electrically coupled to the memory cell MC07 via the transistor T20. The output terminal of the sense amplifier 58 is electrically coupled to the input terminal of the XOR circuit 67 via the transistor T21.

The control terminal of the transistor T10 is electrically coupled to a control line SA1. The control terminals of the transistors T20, T21 are electrically coupled to a control line SA2. The control terminal of the transistor T30 is electrically coupled to a control line SA3. The control terminals of the transistors T40, T41 are electrically coupled to a control line SA4. A predetermined voltage is supplied to the control lines SA1-SA4 for read operation from a control circuit (not shown).

FIG. 6 is a circuit diagram showing the sense amplifier 51 in the semiconductor memory device according to the first embodiment.

As shown in FIG. 6, the sense amplifier 51 includes a first inverter, a second inverter, NMOS transistors NM13, NM14, NM17, NM18, NM19, NM20, PMOS transistors PM13, PM14, a first pass transistor, and a second pass transistor.

The first inverter includes a PMOS transistor PM11 and an NMOS transistor NM11. The first inverter has a first input terminal, a first output terminal, and first and second voltage terminals. The second inverter includes a PMOS transistor PM12 and an NMOS transistor NM11. The second inverter has a first input terminal, a first output terminal, and first and second voltage terminals.

The first voltage terminal of the first inverter (first terminal of the PMOS transistor PM11) and the first voltage terminal of the second inverter (first terminal of the PMOS transistor PM12) are electrically coupled to a power supply voltage VDD. The first input terminal of the second inverter (gates of the PMOS transistor PM12 and the NMOS transistor NM12) is electrically coupled to the first output terminal of the first inverter (the second terminal of the PMOS transistor PM11 and the first terminal of the NMOS transistor NM11) and the first output terminal of the second inverter (the second terminal of the PMOS transistor PM12 and the first terminal of the NMOS transistor NM12) is electrically coupled to the first input terminal of the first inverter (gates of the PMOS transistor PM11 and the NMOS transistor NM11).

The first pass transistor includes an NMOS transistor NM15 and a PMOS transistor PM15. The second pass transistor includes an NMOS transistor NM16 and a PMOS transistor PM16.

The first terminal of the PMOS transistor PM13 is electrically coupled to the first output terminal of the first inverter and the second terminal of the PMOS transistor PM13 is electrically coupled to the power supply voltage VDD. The first terminal of the PMOS transistor PM14 is electrically coupled to the first output terminal of the second inverter and the second terminal of the PMOS transistor PM14 is electrically coupled to the power supply voltage VDD. A signal SEN1 is supplied to the gates of the PMOS transistors PM13, PM14.

The first pass transistor (the NMOS transistor NM15 and the PMOS transistor PM15) is electrically coupled to the first output terminal of the first inverter. Signals RLEN, RLENb are supplied to the gates of the NMOS transistor NM15 and the PMOS transistor PM15 respectively. The second pass transistor (the NMOS transistor NM16 and the PMOS transistor PM16) is electrically coupled to the first output terminal of the second inverter. The signals RLEN, RLENb are supplied to the gates of the NMOS transistor NM16 and the PMOS transistor PM16 respectively.

The first terminal of the NMOS transistor NM13 is electrically coupled to the second output terminal of the first inverter (second terminal of the NMOS transistor NM11) and the second terminal of the NMOS transistor NM13 is electrically coupled to a ground voltage VSS. The first terminal of the NMOS transistor NM14 is electrically coupled to the second output terminal of the second inverter (second terminal of the NMOS transistor NM12) and the second terminal of the NMOS transistor NM14 is electrically coupled to the ground voltage VSS. A signal SEN2 is supplied to the gates of the NMOS transistors NM13, NM14.

Also, the second voltage terminal of the first inverter (second terminal of the NMOS transistor NM11) is electrically coupled to the first terminal of the NMOS transistor NM17. The second terminal of the NMOS transistor NM17 is electrically coupled to the first terminal of the NMOS transistor NM18. The second terminal of the NMOS transistor NM18 becomes the first input terminal A of the sense amplifier 51.

Also, the second voltage terminal of the second inverter (second terminal of the NMOS transistor NM12) is electrically coupled to the first terminal of the NMOS transistor NM19. The second terminal of the NMOS transistor NM19 is electrically coupled to the first terminal of the NMOS transistor NM20. The second terminal of the NMOS transistor NM20 becomes the second input terminal B of the sense amplifier 51.

A signal REN is supplied to the gates of the NMOS transistors NM17, NM19.

A signal Vclamp is supplied to the gate of the NMOS transistor NM18 from a clamp voltage generator 71. A signal Vref is supplied to the gate of the NMOS transistor NM20 from a reference voltage generator 72.

The clamp voltage generator 71 has a constant current source 71A, an NMOS transistor 71B, and a variable resistor 71C. The first terminal and the control terminal of the NMOS transistor 71B are diode-coupled. The constant current source 71A that passes a constant current to the first terminal of the NMOS transistor NM71B is electrically coupled. Also, an end of the variable resistor 71C is electrically coupled to the second terminal of the NMOS transistor NM71B and the ground voltage VSS is electrically coupled to the other end of the variable resistor 71C. The clamp voltage generator 71 outputs the signal Vclamp from the gate of the NMOS transistor NM71B. The signal Vclamp is an analog signal and the level of the signal Vclamp is an intermediate level equal to the ground voltage VSS or more and equal to the power supply voltage VDD or less. That is, the NMOS transistor NM18 is turned on in an analog manner by the signal Vclamp.

The reference voltage generator 72 has a constant current source 72A, an NMOS transistor NM72B, and a variable resistor 72C. The first terminal and the control terminal of the NMOS transistor NM72B are diode-coupled. The constant current source 72A that passes a constant current to the first terminal of the NMOS transistor NM72B is electrically coupled. Also, an end of the variable resistor 72C is electrically coupled to the second terminal of the NMOS transistor NM72B and the ground voltage VSS is electrically coupled to the other end of the variable resistor 72C. The reference voltage generator 72 outputs the signal Vref from the gate of the NMOS transistor NM72B. The signal Vref is an analog signal and the level of the signal Vref is an intermediate level equal to the ground voltage VSS or more and equal to the power supply voltage VDD or less. That is, the NMOS transistor NM20 is turned on in an analog manner by the signal Vref.

Even if there is no difference in resistance between two memory cells, the sense amplifier 51 reads data by artificially providing a difference inside the sense amplifier 51. Thus, the sense amplifier 51 has an asymmetric configuration on the first input terminal A side and the second input terminal B side. For example, the gate length of the transistor NM18 and that of the transistor NM20 are different. Alternatively, the impurity concentration of channels of the transistor NM18 and that of channels of the transistor NM20 are different. Alternatively, the voltage level of the signal Vclamp supplied for reading and that of the signal Vref are different.

The sense amplifiers 52-58 have the same configuration as that of the sense amplifier 51 and so the description thereof is omitted.

[Reading in the First Embodiment]

First, reading by the read circuit 41 will be described using FIG. 4.

As shown in FIG. 4, the read circuit 41 compares the resistance of the memory cell MC00 and that of the memory cell MC01. Then, the read circuit 41 reads data in accordance with the comparison result. More specifically, the read circuit 41 reads data as shown below when the memory cells MC00, MC01 are (1) to (4):
(1) MC00: high resistance, MC01: high resistance→"0"
(2) MC00: high resistance, MC01: low resistance→"1"
(3) MC00: low resistance, MC01: high resistance→"1"
(4) MC00: low resistance, MC01: low resistance→"0"

That is, the read circuit 41 reads data as "0(L)" when the resistance of the memory cell MC00 and that of the memory cell MC01 are the same ((1) and (4)). On the other hand, the read circuit 41 reads data as "1(H)" when the resistance of the memory cell MC00 and that of the memory cell MC01 are different ((2) and (3)).

Next, a concrete example of the above reading by the read circuit 41 will be described using FIG. 5. Here, the reading is implemented by using the sense amplifiers 51, 52 and the XOR circuit 61 as the read circuit 41.

An ordinary sense amplifier reads data "0" or "1" by detecting a difference (magnitude) of resistance between two memory cells. Thus, if there is no difference of resistance between two memory cells (two memory cells have the same resistance), the ordinary sense amplifier can read no data. In contrast, the read circuit 41 in the present example can read data even if there is no difference of resistance between two memory cells by including the sense amplifiers 51, 52 and the XOR circuit 61.

As shown in FIG. 5, the memory cell MC01 is electrically coupled to the first input terminal A of the sense amplifier 51 and the memory cell MC00 is electrically coupled to the second input terminal B of the sense amplifier 51. On the other hand, the memory cell MC00 is electrically coupled to the first input terminal A of the sense amplifier 52 and the memory cell MC01 is electrically coupled to the second input terminal B of the sense amplifier 52. That is, the connection of the sense amplifier 51 and the memory cells MC00, MC01 is such that the connections of the input terminals are interchanged when compared with the connection of the sense amplifier 52 and the memory cells MC00, MC01. Accordingly, the sense amplifiers 51, 52 output data as shown below when the memory cells MC00, MC01 are (1) to (4): Sense amplifier 51
(1) MC00(B): high resistance, MC01(A): high resistance→"0"
(2) MC00(B): high resistance, MC01(A): low resistance→"0"
(3) MC00(B): low resistance, MC01(A): high resistance→"1"
(4) MC00(B): low resistance, MC01(A): low resistance→"0" Sense amplifier 52
(1) MC00(A): high resistance, MC01(B): high resistance→"0"
(2) MC00(A): high resistance, MC01(B): low resistance→"1"
(3) MC00(A): low resistance, MC01(B): high resistance→"0"
(4) MC00(A): low resistance, MC01(B): low resistance→"0"

Each of the sense amplifies 51, 52 outputs "0" when the first input terminal A is of low resistance and the second input terminal B is of high resistance ((2) of the sense amplifier 51 and (3) of the sense amplifier 52). Also, each of the sense amplifies 51, 52 outputs "1" when the first input terminal A is of high resistance and the second input terminal B is of low resistance ((3) of the sense amplifier 51 and (2) of the sense amplifier 52).

Further, each of the sense amplifies 51, 52 outputs "0" when the first input terminal A is of low resistance and the second input terminal B is of low resistance ((4) of the sense amplifier 51 and (4) of the sense amplifier 52) or the first input terminal A is of high resistance and the second input terminal B is of high resistance ((1) of the sense amplifier 51 and (1) of the sense amplifier 52). This is because of the reason described below:

Thus, each of the sense amplifies 51, 52 has an asymmetric configuration on the first input terminal A side and the second input terminal B side. Accordingly, even when there is no difference of resistance between the memory cells MC00, MC01, the sense amplifiers 51, 52 are artificially provided with a resistance difference inside the sense amplifiers 51, 52. Here, an example in which even when there is no difference of resistance between the memory cells MC00, MC01, the second input terminal B side becomes artificially of higher resistance than the first input terminal A side is shown. Thus, each of the sense amplifies 51, 52 outputs, like when the first input terminal A is of low resistance and the second input terminal B is of high resistance ((2) of the sense amplifier 51 and (3) of the sense amplifier 52), "0" when the first input terminal A is of low resistance and the second input terminal B is of low resistance ((1) of the sense amplifier 51 and (1) of the sense amplifier 52) or the first input terminal A is of high resistance and the second input terminal B is of high resistance ((4) of the sense amplifier 51 and (4) of the sense amplifier 52).

The XOR circuit 61 performs an XOR operation on output of the sense amplifiers 51, 52 to output data as described below when the memory cells MC00, MC01 are (1) to (4):
(1) Sense amplifier 51: "0", Sense amplifier 52: "0"→"0"
(2) Sense amplifier 51: "0", Sense amplifier 52: "1"→"1"
(3) Sense amplifier 51: "1", Sense amplifier 52: "0"→"1"
(4) Sense amplifier 51: "0", Sense amplifier 52: "0"→"0"

The output of the XOR circuit 61 becomes the final read data by the read circuit 41 described above.

Similarly, the read circuit 42 corresponds to the sense amplifiers 52, 53 and the XOR circuits 62 and compares the resistance of the memory cell MC01 and that of the memory cell MC02 to read data in accordance with the comparison result. Also, the read circuit 43 corresponds to the sense amplifiers 53, 54 and the XOR circuits 63 and compares the resistance of the memory cell MC02 and that of the memory cell MC03 to read data in accordance with the comparison result. Also, the read circuit 44 corresponds to the sense amplifiers 54, 55 and the XOR circuits 64 and compares the resistance of the memory cell MC03 and that of the memory cell MC04 to read data in accordance with the comparison result. Also, the read circuit 45 corresponds to the sense amplifiers 55, 56 and the XOR circuits 65 and compares the resistance of the memory cell MC04 and that of the memory cell MC05 to read data in accordance with the comparison result. Also, the read circuit 46 corresponds to the sense amplifiers 56, 57 and the XOR circuits 66 and compares the resistance of the memory cell MC05 and that of the memory cell MC06 to read data in accordance with the comparison result. Also, the read circuit 47 corresponds to the sense amplifiers 57, 58 and the XOR circuits 67 and compares the resistance of the memory cell MC06 and that of the memory cell MC07 to read data in accordance with the comparison result.

In this manner, the n-th read circuit is electrically coupled to the n-th memory cell and the (n+1)-th memory cell and compares these resistances to read data.

Therefore, n-bit data is read by n read circuits from (n+1) memory cells.

[Timing Chart of Reading in the First Embodiment]

Hereinafter, the timing chart of reading by the read circuits will be described blow using FIGS. 6, 7, 8, 9, 10, and 11.

Figure 7:
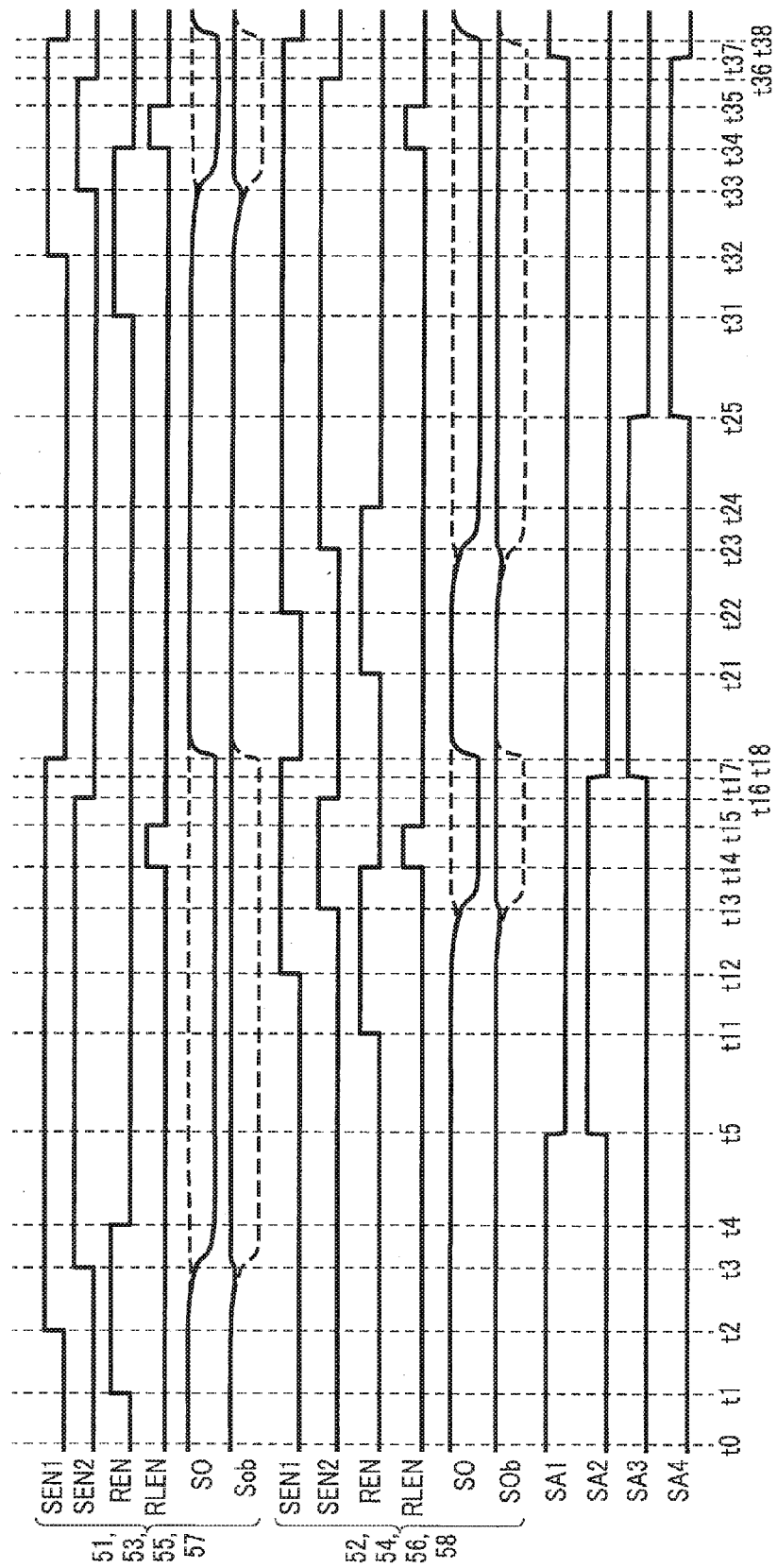
FIG. 7 is a timing chart of various voltage levels during reading in the semiconductor memory device according to the first embodiment.
Figure 8:
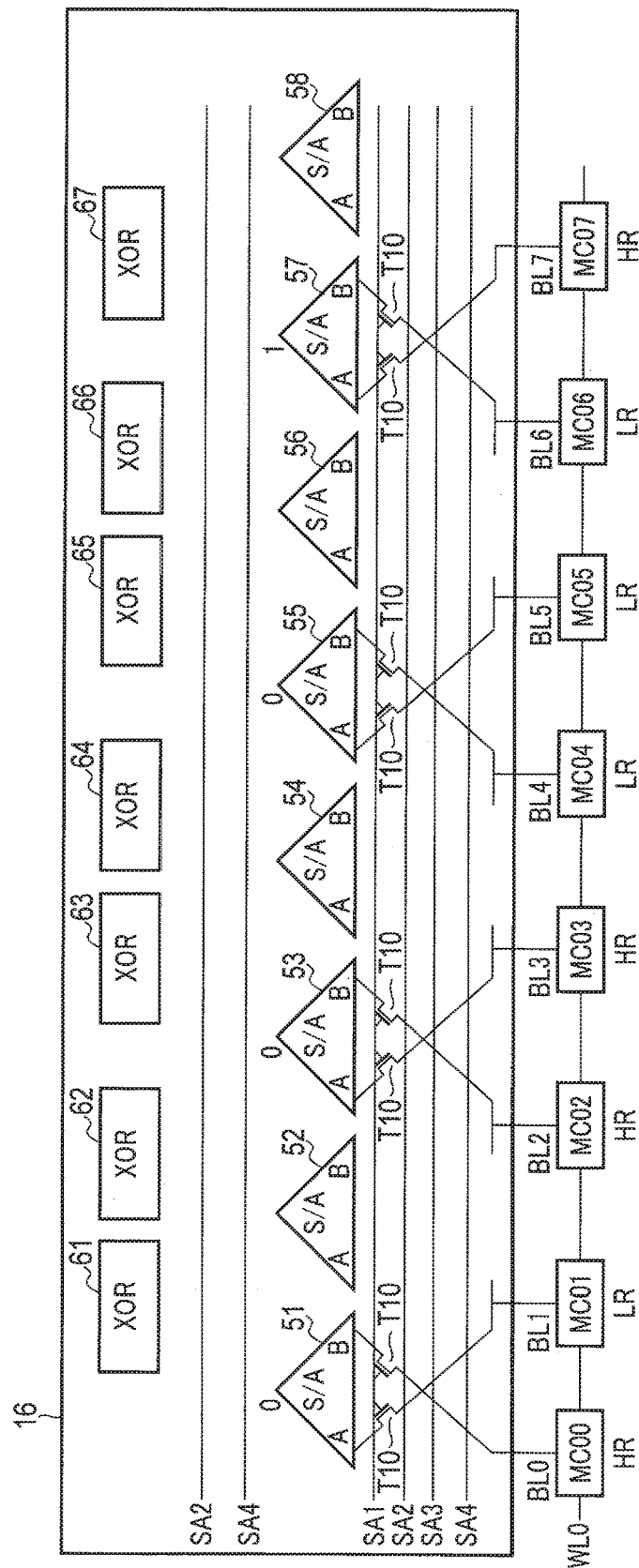
FIG. 8 is a diagram showing connection relations of a read/write circuit at times t0 to t5 in FIG. 7.
Figure 9:
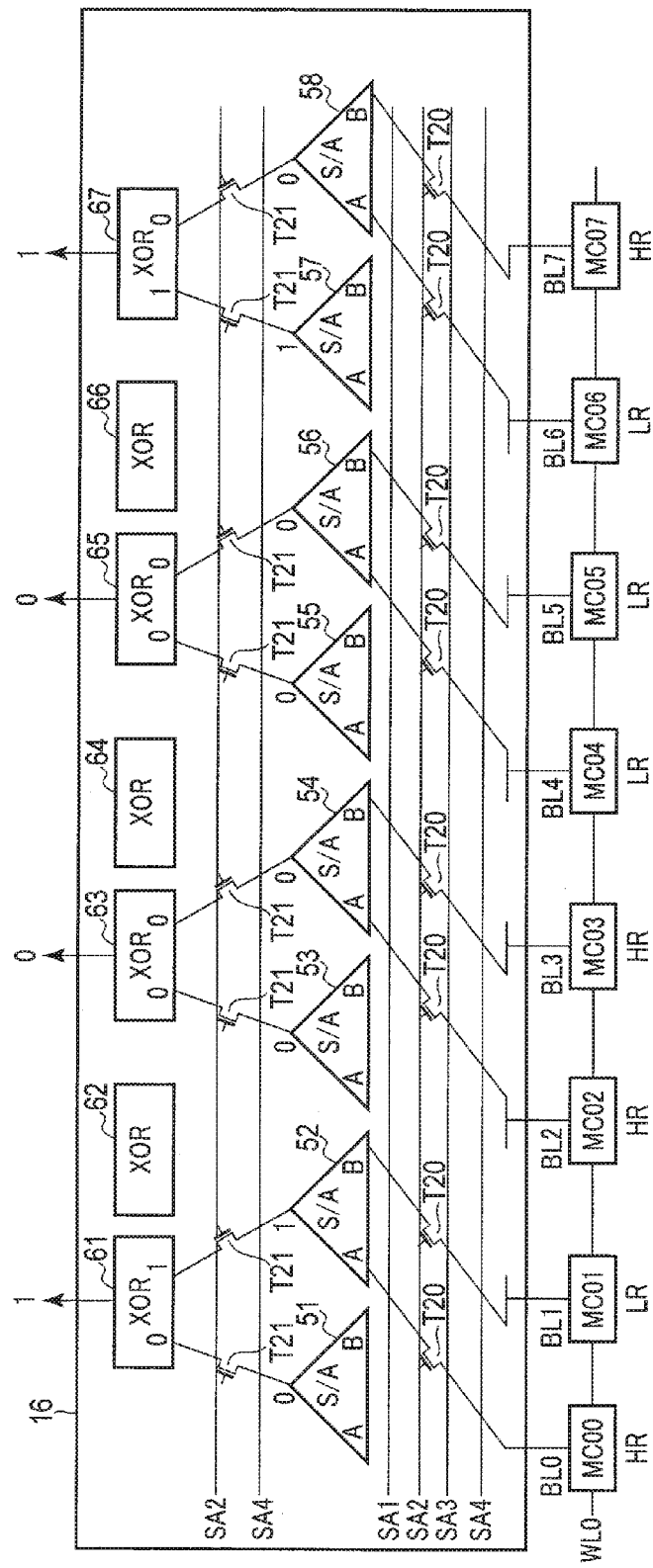
FIG. 9 is a diagram showing connection relations of the read/write circuit at times t5 to t17 in FIG. 7.
Figure 10:
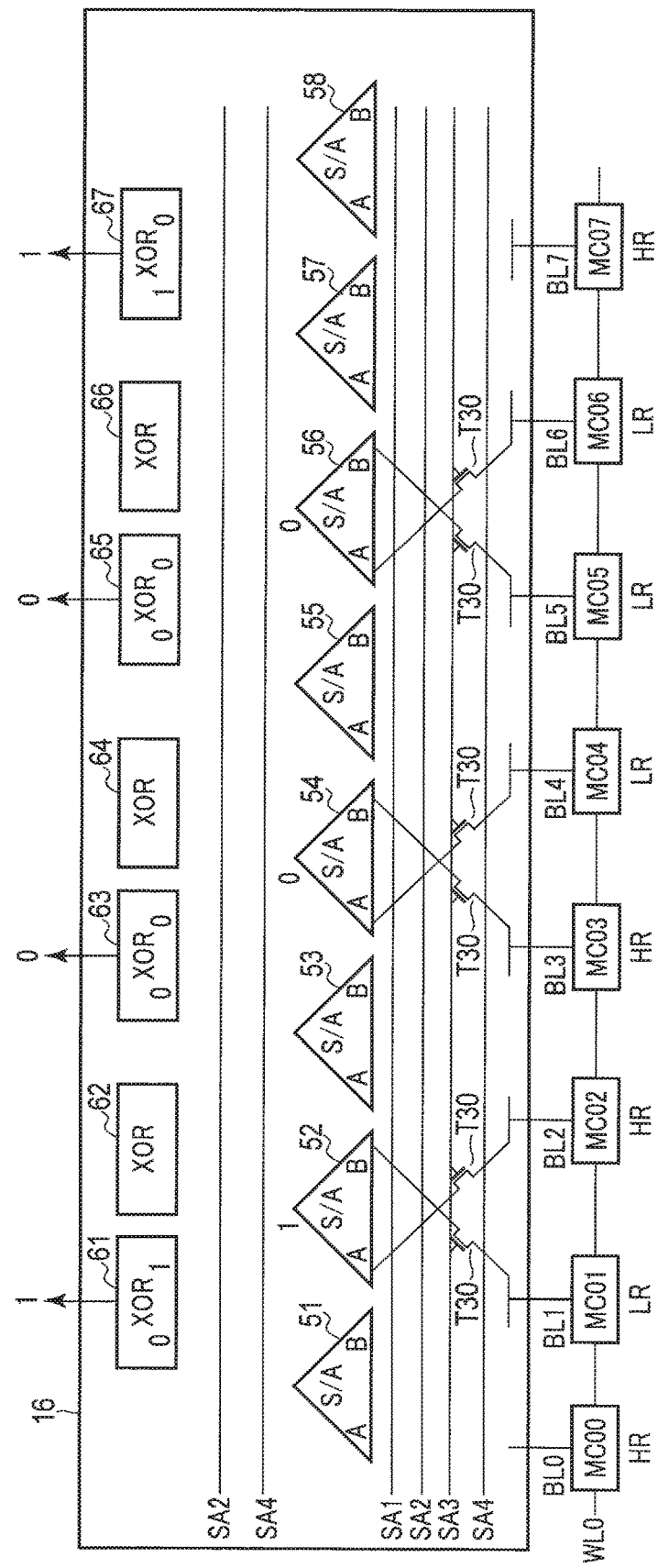
FIG. 10 is a diagram showing connection relations of the read/write circuit at times t17 to t25 in FIG. 7.

FIG. 7 shows a timing chart of various voltage levels during reading in the semiconductor memory device according to the first embodiment. FIG. 8 is a diagram showing connection relations of the read/write circuit 16 at times t0 to t5 in FIG. 7. FIG. 9 is a diagram showing connection relations of the read/write circuit 16 at times t5 to t17 in FIG. 7. FIG. 10 is a diagram showing connection relations of the read/write circuit 16 at times t17 to t25 in FIG. 7. FIG. 11 is a diagram showing connection relations of the read/write circuit 16 at times t25 to t37 in FIG. 7.

In FIGS. 8, 9, 10, and 11, an example in which the memory cells MC00-MC07 are of high resistance (HR), low resistance (LR), high resistance, high resistance, low resistance, low resistance, low resistance, and high resistance respectively is shown. In FIGS. 8, 9, 10, and 11, only transistors in an on state are shown and transistors in an off state are omitted. Signals supplied to the sense amplifiers 51, 53, 55, 57 are common and these sense amplifiers operate simultaneously and signals supplied to the sense amplifiers 52, 54, 56, 58 are common and these sense amplifiers operate simultaneously.

As shown in FIGS. 6, and 7, the signal SEN1 is at an "L" level and the PMOS transistors PM13, PM14 are turned on in all the sense amplifiers 51-58 in a standby state before reading is started (prior to time t0). Also, the signals SEN2, RLEN, REN are at the "L" level and the signal RLENb is at an "H" level in all the sense amplifiers 51-58. Accordingly, transistors to which these signals are supplied are turned off. Though not illustrated, the signal Vclamp is changed to an intermediate level ("M" level) as an analog signal by the clamp voltage generator 71 and the NMOS transistor NM18 is turned on in an analog manner in accordance with the "M" level. Also, though not illustrated, the signal Vref is changed to an intermediate level ("M" level) as an analog signal by the reference voltage generator 72 and the NMOS transistor NM20 is turned on in an analog manner in accordance with the "M" level.

Then, in the present example, first reading to fourth reading are successively performed.

First, the first reading is performed at times t0 to t5. As shown in FIGS. 6 and 7, the signal SEN1 is at the "L" level in all the sense amplifiers 51-58 in an initial state (time t0) of the first reading and a node SO and a node SOb are precharged to the power supply voltage VDD. Also, as shown in FIGS. 7 and 8, the control line SA1 is at the "H" level at time t0 and thus, the transistor T10 is turned on. Accordingly, the first input terminal A of the sense amplifier 51 and the memory cell MC01 are electrically coupled and the second input terminal B of the sense amplifier 51 and the memory cell MC00 are electrically coupled. Similarly, the first input terminal A of the sense amplifiers 53, 55, 57 and the memory cells MC03, MC05, MC07 are electrically coupled and the second input terminal B of the sense amplifiers 53, 55, 57 and the memory cells MC02, MC04, MC06 are electrically coupled.

Next, as shown in FIGS. 6 and 7, at time t1, the signal REN in the sense amplifiers 51, 53, 55, 57 changes to the "H" level and the NMOS transistors NM17, NM19 in the sense amplifiers 51, 53, 55, 57 are turned on.

Next, as shown in FIGS. 6 and 7, at time t2, the signal SEN1 in the sense amplifiers 51, 53, 55, 57 changes to the "H" level and the PMOS transistors PM13, PM14 in the sense amplifiers 51, 53, 55, 57 are turned off. Accordingly, the node SO and the node SOb in the sense amplifiers 51, 53, 55, 57 stop being precharged. As a result, the read current becomes a current supplied only from the power supply voltage VDD coupled to the first terminal of the PMOS transistors PM11, PM12 in the sense amplifiers 51, 53, 55, 57. At this point, the read current changes depending on whether the memory cell MC is of low resistance or high resistance.

Next, as shown in FIGS. 6, 7 and 8, at time t3, the signal SEN2 in the sense amplifiers 51, 53, 55, 57 changes to the "H" level and the NMOS transistors NM13, NM14 in the sense amplifiers 51, 53, 55, 57 are turned on. Accordingly, the read current flowing to the first input terminal A and the read current flowing to the second input terminal B are each compared in the sense amplifiers 51, 53, 55, 57. Then, the "H(1)" level or "L(0)" level is held according to the comparison result in a latch circuit constructed of the PMOS transistors PM11, PM12 and the NMOS transistors NM11, NM12 in the sense amplifiers 51, 53, 55, 57. That is, each of the nodes SO, SOb in the sense amplifiers 51, 53, 55, 57 changes to the "H" level or "L" level.

Here, as shown in FIG. 8, the sense amplifier 51 holds "0" because the first input terminal A is of LR and the second input terminal B is of HR. Also, the sense amplifier 53 holds "0" because the first input terminal A is of HR and the second input terminal B is of HR. The sense amplifier 55 holds "0" because the first input terminal A is of LR and the second input terminal B is of LR. The sense amplifier 57 holds "1" because the first input terminal A is of HR and the second input terminal B is of LR.

Next, as shown in FIGS. 6 and 7, at time t4, the signal REN in the sense amplifiers 51, 53, 55, 57 changes to the "L" level and the NMOS transistors NM17, NM18 are turned off.

Then, as shown in FIGS. 7 and 8, the control line SA1 changes to the "L" level at time t5 to complete the first reading.

Next, the second reading is performed at times t5 to t18. Hereinafter, the description of aspects similar to those of the first reading is omitted when appropriate.

As shown in FIGS. 6 and 7, the signal SEN1 is at the "L" level in the sense amplifiers 52, 54, 56, 58 in an initial state (time t5) of the second reading and the node SO and the node SOb in the sense amplifiers 52, 54, 56, 58 are precharged to the power supply voltage VDD. Also, as shown in FIGS. 7 and 9, the control line SA2 is at the "H" level at time t5 and thus, the transistor T20 is turned on. Accordingly, the first input terminal A of the sense amplifier 52 and the memory cell MC00 are electrically coupled and the second input terminal B of the sense amplifier 52 and the memory cell MC01 are electrically coupled. Similarly, the first input terminal A of the sense amplifiers 54, 56, 58 and the memory cells MC02, MC04, MC06 are electrically coupled and the second input terminal B of the sense amplifiers 54, 56, 58 and the memory cells MC03, MC05, MC07 are electrically coupled.

Next, as shown in FIGS. 6 and 7, the signal REN in the sense amplifiers 52, 54, 56, 58 changes to the "H" level at time t11 and the signal SEN1 in the sense amplifiers 52, 54, 56, 58 changes to the "H" level at time t12. Accordingly, the node SO and the node SOb in the sense amplifiers 52, 54, 56, 58 stop being precharged.

Next, as shown in FIGS. 6, 7 and 9, at time t13, the signal SEN2 in the sense amplifiers 52, 54, 56, 58 changes to the "H" level and the NMOS transistors NM13, NM14 in the sense amplifiers 52, 54, 56, 58 are turned on. Accordingly, the read current flowing to the first input terminal A and the read current flowing to the second input terminal B are each compared in the sense amplifiers 52, 54, 56, 58. Then, the "H(1)" level or "L(0)" level is held according to the comparison result in the latch circuit constructed of the PMOS transistors PM11, PM12 and the NMOS transistors NM11, NM12 in the sense amplifiers 52, 54, 56, 58.

Here, as shown in FIG. 9, the sense amplifier 52 holds "1" because the first input terminal A is of HR and the second input terminal B is of LR. Also, the sense amplifier 54 holds "0" because the first input terminal A is of HR and the second input terminal B is of HR. The sense amplifier 56 holds "0" because the first input terminal A is of LR and the second input terminal B is of LR. The sense amplifier 58 holds "0" because the first input terminal A is of LR and the second input terminal B is of HR.

Next, as shown in FIGS. 6 and 7, at time t14, the signal RLEN in the sense amplifiers 51-58 changes to the "H" level and the signal RLENb changes to the "L" level to turn on the NMOS transistors NM15, NM16 and the PMOS transistors PM15, PM16 in the sense amplifiers 51-58. Accordingly, an output signal is output from each of the nodes SO, SOb in the sense amplifiers 51-58.

At this point, as shown in FIG. 9, the control line SA2 is at the "H" level and thus, the transistor T21 is in an on state. Thus, the output "0" from the sense amplifier 51 and the output "1" from the sense amplifier 52 are input into the XOR circuit 61. Similarly, the output "0" from the sense amplifier 53 and the output "0" from the sense amplifier 54 are input into the XOR circuit 63, the output "0" from the sense amplifier 55 and the output "0" from the sense amplifier 56 are input into the XOR circuit 65, and the output "1" from the sense amplifier 57 and the output "0" from the sense amplifier 58 are input into the XOR circuit 67.

The XOR circuit 61 performs an XOR operation of the output "0" from the sense amplifier 51 and the output "1" from the sense amplifier 52. Accordingly, the XOR circuit 61 outputs "1". Similarly, the XOR circuit 63 performs an XOR operation of the output "0" from the sense amplifier 53 and the output "0" from the sense amplifier 54 to output "0". Also, the XOR circuit 65 performs an XOR operation of the output "0" from the sense amplifier 55 and the output "0" from the sense amplifier 56 to output "0". Also, the XOR circuit 67 performs an XOR operation of the output "1" from the sense amplifier 57 and the output "0" from the sense amplifier 58 to output "1".

Then, the signal RLEN (RLENb) in the sense amplifiers 51-58 changes to the "L" ("H") level at time t15, the signal SEN2 in the sense amplifiers 51-58 changes to the "L" level at time t16, the control line SA2 changes to the "L" level at time t17, and the signal SEN1 in the sense amplifiers 51-58 changes to the "L" level at time t18. Accordingly, transistors to which these signals or the control line is supplied are turned off to complete the second reading.

In this manner, the resistance of the (2n−1)(n is an integer equal to 1 or greater)-th memory cell MC and that of the 2n-th memory cell are compared in the first reading and the second reading to read data in accordance with the comparison result. That is, data is read as "0" when the two memory cells MC have the same resistance and data is read as "1" when the two memory cells MC have different resistances.

Next, the third reading is performed at times t18 to t25. Hereinafter, the description of aspects similar to those of the first reading is omitted when appropriate.

As shown in FIGS. 6 and 7, the signal SEN1 is at the "L" level in all the sense amplifiers 51-58 in an initial state (time t18) of the third reading and the node SO and the node SOb are precharged to the power supply voltage VDD. Also, as shown in FIGS. 7 and 10, the control line SA3 is at the "H" level at time t18 and thus, the transistor T30 is turned on. Accordingly, the first input terminal A of the sense amplifier 52 and the memory cell MC02 are electrically coupled and the second input terminal B of the sense amplifier 52 and the memory cell MC01 are electrically coupled. Similarly, the first input terminal A of the sense amplifiers 54, 56 and the memory cells MC04, MC06 are electrically coupled and the second input terminal B of the sense amplifiers 54, 56 and the memory cells MC03, MC05 are electrically coupled.

Next, as shown in FIGS. 6 and 7, the signal REN in the sense amplifiers 52, 54, 56 changes to the "H" level at time t21 and the signal SEN1 in the sense amplifiers 52, 54, 56 changes to the "H" level at time t22. Accordingly, the node SO and the node SOb in the sense amplifiers 52, 54, 56 stop being precharged.

Next, as shown in FIGS. 6, 7 and 10, at time t23, the signal SEN2 in the sense amplifiers 52, 54, 56 changes to the "H" level and the NMOS transistors NM13, NM14 in the sense amplifiers 52, 54, 56 are turned on. Accordingly, the read current flowing to the first input terminal A and the read current flowing to the second input terminal B are each compared in the sense amplifiers 52, 54, 56. Then, the "H(1)" level or "L(0)" level is held according to the comparison result in the latch circuit constructed of the PMOS transistors PM11, PM12 and the NMOS transistors NM11, NM12 in the sense amplifiers 52, 54, 56.

Here, as shown in FIG. 10, the sense amplifier 52 holds "1" because the first input terminal A is of HR and the second input terminal B is of LR. Also, the sense amplifier 54 holds "0" because the first input terminal A is of LR and the second input terminal B is of HR. The sense amplifier 56 holds "0" because the first input terminal A is of LR and the second input terminal B is of LR.

Next, as shown in FIGS. 6 and 7, at time t24, the signal REN in the sense amplifiers 52, 54, 56 changes to the "L" level and the NMOS transistors NM17, NM18 are turned off.

Then, as shown in FIGS. 7 and 8, the control line SA3 changes to the "L" level at time t25 to complete the third reading.

Next, the fourth reading is performed at times t25 to t38. Hereinafter, the description of aspects similar to those of the first reading is omitted when appropriate.

As shown in FIGS. 6 and 7, the signal SEN1 is at the "L" level in the sense amplifiers 53, 55, 57 in an initial state (time t25) of the fourth reading and the node SO and the node SOb in the sense amplifiers 53, 55, 57 are precharged to the power supply voltage VDD. Also, as shown in FIGS. 7 and 11, the control line SA4 is at the "H" level at time t25 and thus, the transistor T40 is turned on.

Accordingly, the first input terminal A of the sense amplifier 53 and the memory cell MC01 are electrically coupled and the second input terminal B of the sense amplifier 53 and the memory cell MC02 are electrically coupled. Similarly, the first input terminal A of the sense amplifiers 55, 57 and the memory cells MC03, MC05 are electrically coupled and the second input terminal B of the sense amplifiers 55, 57 and the memory cells MC04, MC06 are electrically coupled.

Next, as shown in FIGS. 6 and 7, the signal REN in the sense amplifiers 53, 55, 57 changes to the "H" level at time t31 and the signal SEN1 in the sense amplifiers 53, 55, 57 changes to the "H" level at time t32. Accordingly, the node SO and the node SOb in the sense amplifiers 53, 55, 57 stop being precharged.

Next, as shown in FIGS. 6, 7 and 11, at time t33, the signal SEN2 in the sense amplifiers 53, 55, 57 changes to the "H" level and the NMOS transistors NM13, NM14 in the sense amplifiers 53, 55, 57 are turned on. Accordingly, the read current flowing to the first input terminal A and the read current flowing to the second input terminal B are each compared in the sense amplifiers 53, 55, 57. Then, the "H(1)" level or "L(0)" level is held according to the comparison result in the latch circuit constructed of the PMOS transistors PM11, PM12 and the NMOS transistors NM11, NM12 in the sense amplifiers 53, 55, 57.

Here, as shown in FIG. 11, the sense amplifier 53 holds "0" because the first input terminal A is of LR and the second input terminal B is of HR. Also, the sense amplifier 55 holds "1" because the first input terminal A is of HR and the second input terminal B is of LR. The sense amplifier 57 holds "0" because the first input terminal A is of LR and the second input terminal B is of LR.

Next, as shown in FIGS. 6 and 7, at time t34, the signal RLEN in the sense amplifiers 51-58 changes to the "H" level and the signal RLENb changes to the "L" level to turn on the NMOS transistors NM15, NM16 and the PMOS transistors PM15, PM16 in the sense amplifiers 51-58. Accordingly, an output signal is output from each of the nodes SO, SOb in the sense amplifiers 51-58.

At this point, as shown in FIG. 11, the control line SA4 is at the "H" level and thus, the transistor T41 is in an on state. Thus, the output "1" from the sense amplifier 52 and the output "0" from the sense amplifier 53 are input into the XOR circuit 62. Similarly, the output "0" from the sense amplifier 54 and the output "1" from the sense amplifier 55 are input into the XOR circuit 64 and the output "0" from the sense amplifier 56 and the output "0" from the sense amplifier 57 are input into the XOR circuit 66.

The XOR circuit 62 performs an XOR operation of the output "1" from the sense amplifier 52 and the output "0" from the sense amplifier 53. Accordingly, the XOR circuit 62 outputs "1". Similarly, the XOR circuit 64 performs an XOR operation of the output "0" from the sense amplifier 54 and the output "1" from the sense amplifier 55 to output "1". Also, the XOR circuit 66 performs an XOR operation of the output "0" from the sense amplifier 56 and the output "0" from the sense amplifier 57 to output "0".

Then, the signal RLEN (RLENb) in the sense amplifiers 51-58 changes to the "L" ("H") level at time t35, the signal SEN2 in the sense amplifiers 51-58 changes to the "L" level at time t36, the control line SA4 changes to the "L" level at time t37, and the signal SEN1 in the sense amplifiers 51-58 changes to the "L" level at time t38. Accordingly, transistors to which these signals or the control line is supplied are turned off to complete the fourth reading.

In this manner, the resistance of the 2n-th memory cell MC and that of the (2n+1)-th memory cell are compared in the third reading and the fourth reading to read data in accordance with the comparison result. That is, data is read as "0" when the two memory cells MC have the same resistance and data is read as "1" when the two memory cells MC have different resistances.

[Writing in the First Embodiment]

Hereinafter, writing according to the first embodiment will be described. In the present example, as described above, 1-bit data is stored by two neighboring memory cells. Then, data is written such that "1" data corresponds to a state in which two memory cells have different resistances and "0" data corresponds to a state in which two memory cells have the same resistance.

Here, as shown in, for example, FIG. 11, an example in which "1" is written into the memory cells MC00, MC01, "1" is written into the memory cells MC01, MC02, "0" is written into the memory cells MC02, MC03, "1" is written into the memory cells MC03, MC04, "0" is written into the memory cells MC04, MC05, "0" is written into the memory cells MC05, MC06, and "1" is written into the memory cells MC06, MC07 as data will be described.

First, the resistance of the memory cell MC00 is fixed to HR. Because "1" is written into the memory cells MC00, MC01, the resistance of the memory cell MC01 is set so as to be different from the resistance of the memory cell MC00. Thus, the memory cell MC01 is set to LR.

Next, because "1" is written into the memory cells MC01, MC02, the resistance of the memory cell MC02 is set so as to be different from the resistance of the memory cell MC01. Thus, the memory cell MC02 is set to HR.

Next, because "0" is written into the memory cells MC02, MC03, the resistance of the memory cell MC03 is set so as to be the same as the resistance of the memory cell MC02. Thus, the memory cell MC03 is set to HR.

Hereinafter, data is written into the memory cells MC04, MC05, MC06, MC07 in the same manner. Therefore, the memory cells MC04, MC05, MC06, MC07 are set to LR, LR, LR, HR respectively.

Incidentally, the resistance of the memory cell MC00 is initially fixed to HR, but may also be fixed to LR. In such a case, resistances of the memory cells MC01 to MC07 are reversed values of the above case.

Effects of the First Embodiment

Resistive random access memories including MRAM generally compare and read a difference between reference resistance and memory cell resistance. More specifically, a sense amplifier compares to determine whether memory cell resistance is larger or smaller than reference resistance and reads data in accordance with the comparison result. As the reference resistance, a memory cell (reference cell) or a resistive wire of Si substrate into which impurities are injected is used.

When a reference cell is used as the reference resistance, the reference cell is used repeatedly. Thus, erroneous writing (read disturb) due to a current for reading may occur in the reference cell. Also, an electric breakdown of the tunnel barrier layer of the reference cell may occur, leading to degradation of reliability. As a countermeasure, a method of reducing the number of times of reading each reference cell by increasing the number of reference cells is known. Problems of read disturb and degradation of reliability can thereby be controlled, but problems of an increased chip area caused by an increased number of reference cells and an increase in cost arise.

When a resistive wire of Si substrate is used as the reference resistance, on the other hand, a problem caused by temperature characteristics arises. More specifically, the resistive wire and the memory cell have different temperature characteristics. Thus, resistance variations are caused by a temperature change between the resistive wire and the memory cell. To eliminate such variations, a corrective circuit that corrects differences in temperature characteristic is needed. In addition, resistance variations of the resistive wire are detected for each wafer, leading to degradation of sense margins by the sense amplifier.

According to the first embodiment, by contrast, a read circuit compares resistances of two neighboring memory cells (the n-th memory cell and the (n+1)-th memory cell) and reads data in accordance with the comparison result. More specifically, the read circuit 41 compares the resistance of the memory cell MC00 and that of the memory cell MC10 and reads data in accordance with the comparison result. Also, the read circuit 42 compares the memory cell MC01 and the memory cell MC02 and reads data in accordance with the comparison result. Further, the read circuit 42 compares the memory cell MC02 and the memory cell MC03 and reads data in accordance with the comparison result. At this point, the read circuit reads "0" data when two memory cells have the same resistance and "1" data when two memory cells have different resistances. In this manner, 1-bit data is read from two neighboring memory cells.

When compared with the reference cell, the number of times of reading each memory cell can be reduced by the configuration and the reading method according to the first embodiment. Therefore, problems of read disturb and degradation of reliability can be suppressed. Also, there is no need to increase the number of memory cells like the reference cell and thus, there is no accompanying increase of the chip area. Also, the read circuit is mainly constructed of a sense amplifier and thus, an increase of the chip area can be reduced to a minimum. Further, in the first embodiment, in contrast to the resistive wire, the problem of resistance variations due to temperature characteristics does not arise. Thus, a corrective circuit or the like is not needed. Also, the problem of resistance variations for each wafer does not arise and thus, degradation of sense margins can be suppressed.

Second Embodiment

Hereinafter, a semiconductor memory device according to the second embodiment will be described using FIGS. 12, 13, 14, 15, 16, 17, and 18. In the first embodiment, each read circuit includes two sense amplifiers. In the second embodiment, by contrast, each read circuit includes one sense amplifier.

In the second embodiment, mainly differences will be described while omitting the description of aspects similar to those in the first embodiment.

[Configuration in the Second Embodiment]

Figure 12:
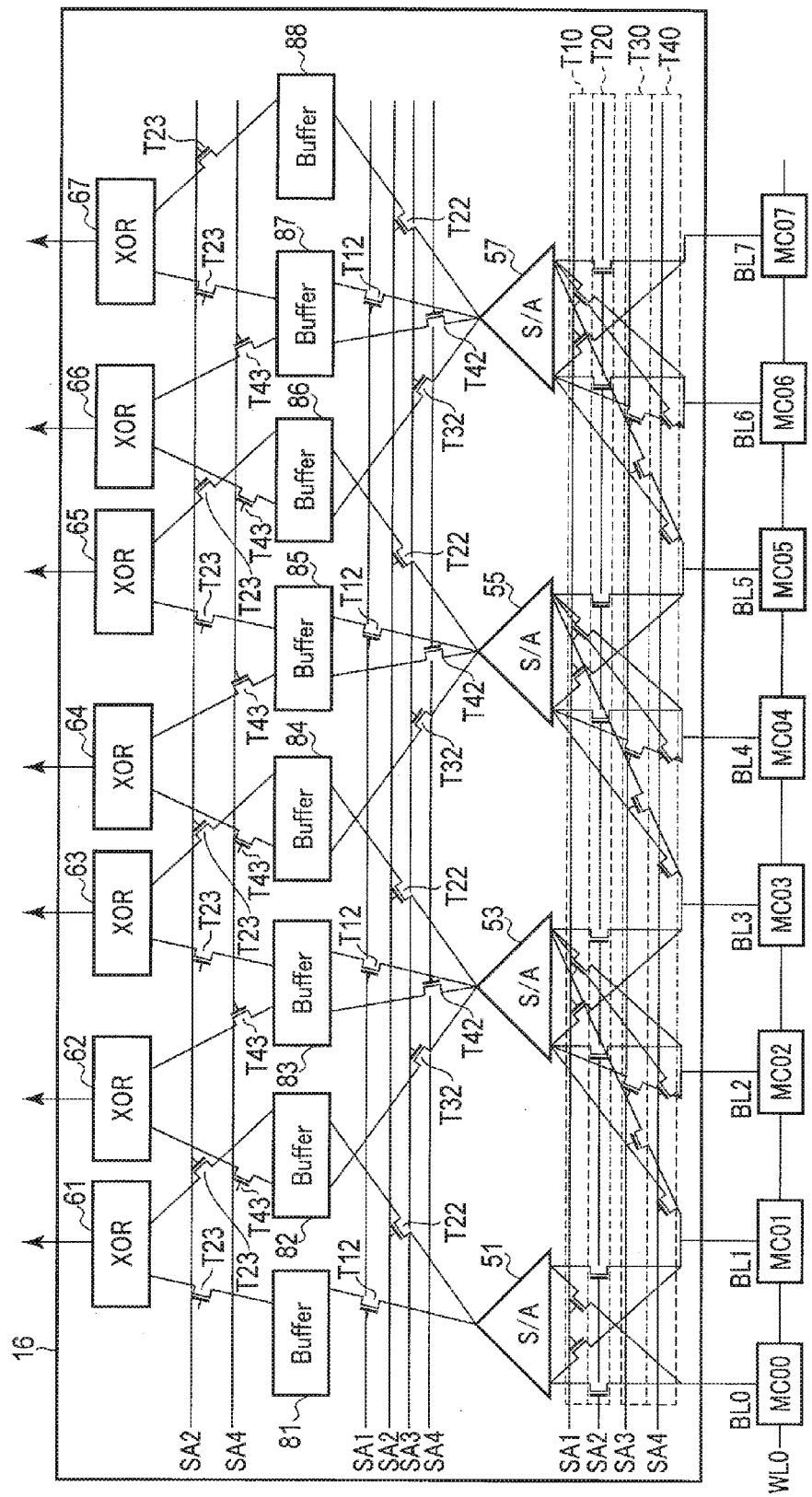
FIG. 12 is a block diagram showing the read/write circuit in the semiconductor memory device according to a second embodiment.

FIG. 12 is a block diagram showing a read/write circuit 16 in the semiconductor memory device according to the second embodiment and a block diagram showing read circuits 41-47 in more detail.

As shown in FIG. 12, the read/write circuit 16 includes sense amplifiers 51, 53, 55, 57, XOR circuits 61-67, transistors T10, T20, T30, T40, T12, T22, T32, T42, T23, T43, and buffers 81-88.

Here, the sense amplifier 51, the XOR circuit 61, and the buffers 81, 82 correspond to the read circuit 41, the sense amplifier 53, the XOR circuit 62, and the buffers 82, 83 correspond to the read circuit 42, and the sense amplifier 53, the XOR circuit 63, and the buffers 83, 84 correspond to the read circuit 43. Similarly, the sense amplifier 55, the XOR circuit 64, and the buffers 84, 85 correspond to the read circuit 44, the sense amplifier 55, the XOR circuit 65, and the buffers 85, 86 correspond to the read circuit 45, the sense amplifier 57, the XOR circuit 66, and the buffers 86, 87 correspond to the read circuit 46, and the sense amplifier 57, the XOR circuit 67, and the buffers 87, 88 correspond to the read circuit 47.

A first input terminal A of the sense amplifier 51 is electrically coupled to a memory cell MC01 via the transistor T10 and further electrically coupled to a memory cell MC00 via the transistor T20. A second input terminal B of the sense amplifier 51 is electrically coupled to the memory cell MC00 via the transistor T10 and further electrically coupled to a memory cell MC10 via the transistor T20.

An output terminal of the sense amplifier 51 is electrically coupled to the XOR circuit 61 via the transistor T12, the buffer 81, and the transistor T23 and further electrically coupled to the XOR circuit 61 via the transistor T22, the buffer 82, and the transistor T23.

The first input terminal A of the sense amplifier 53 is electrically coupled to a memory cell MC03 via the transistor T10, electrically coupled to a memory cell MC02 via the transistor T20, electrically coupled to the memory cell MC02 via the transistor T30, and electrically coupled to the memory cell MC01 via the transistor T40. The second input terminal B of the sense amplifier 53 is electrically coupled to a memory cell MC02 via the transistor T10, electrically coupled to the memory cell MC03 via the transistor T20, electrically coupled to the memory cell MC01 via the transistor T30, and electrically coupled to the memory cell MC02 via the transistor T40.

The output terminal of the sense amplifier 53 is electrically coupled to the XOR circuit 63 via the transistor T12, the buffer 83, and the transistor T23 and further electrically coupled to the XOR circuit 63 via the transistor T22, the buffer 84, and the transistor T23. Also, the output terminal of the sense amplifier 53 is electrically coupled to the XOR circuit 62 via the transistor T32, the buffer 82, and the transistor T43 and further electrically coupled to the XOR circuit 62 via the transistor T42, the buffer 83, and the transistor T43.

The first input terminal A of the sense amplifier 55 is electrically coupled to a memory cell MC05 via the transistor T10, electrically coupled to a memory cell MC04 via the transistor T20, electrically coupled to the memory cell MC04 via the transistor T30, and electrically coupled to the memory cell MC03 via the transistor T40. The second input terminal B of the sense amplifier 55 is electrically coupled to the memory cell MC04 via the transistor T10, electrically coupled to the memory cell MC05 via the transistor T20, electrically coupled to the memory cell MC03 via the transistor T30, and electrically coupled to the memory cell MC04 via the transistor T40.

The output terminal of the sense amplifier 55 is electrically coupled to the XOR circuit 65 via the transistor T12, the buffer 85, and the transistor T23 and further electrically coupled to the XOR circuit 65 via the transistor T22, the buffer 86, and the transistor T23. Also, the output terminal of the sense amplifier 55 is electrically coupled to the XOR circuit 64 via the transistor T32, the buffer 84, and the transistor T43 and further electrically coupled to the XOR circuit 64 via the transistor T42, the buffer 85, and the transistor T43.

The first input terminal A of the sense amplifier 57 is electrically coupled to a memory cell MC07 via the transistor T10, electrically coupled to a memory cell MC06 via the transistor T20, electrically coupled to the memory cell MC06 via the transistor T30, and electrically coupled to the memory cell MC05 via the transistor T40. The second input terminal B of the sense amplifier 57 is electrically coupled to the memory cell MC06 via the transistor T10, electrically coupled to the memory cell MC07 via the transistor T20, electrically coupled to the memory cell MC05 via the transistor T30, and electrically coupled to the memory cell MC06 via the transistor T40.

The output terminal of the sense amplifier 57 is electrically coupled to the XOR circuit 67 via the transistor T12, the buffer 87, and the transistor T23 and further electrically coupled to the XOR circuit 67 via the transistor T22, the buffer 88, and the transistor T23. Also, the output terminal of the sense amplifier 57 is electrically coupled to the XOR circuit 66 via the transistor T32, the buffer 86, and the transistor T43 and further electrically coupled to the XOR circuit 66 via the transistor T42, the buffer 87, and the transistor T43.

The control terminals of the transistors T10, T12 are electrically coupled to a control line SA1. The control terminals of the transistors T20, T22, T23 are electrically coupled to a control line SA2. The control terminals of the transistors T30, T32 are electrically coupled to a control line SA3. The control terminals of the transistors T40, T42, T43 are electrically coupled to a control line SA4. A predetermined voltage is supplied to the control lines SA1-SA4 for read operation from a control circuit (not shown).

[Reading in the Second Embodiment]

Here, the reading like in the first embodiment is implemented by using the sense amplifier 51, the buffers 81, 82, and the XOR circuit 61 as the read circuit 41. As shown in FIG. 12, the memory cell MC01 is electrically coupled to the first input terminal A of the sense amplifier 51 via the transistor T10 and the memory cell MC00 is electrically coupled to the second input terminal B of the sense amplifier 51 via the transistor T20. Further, the memory cell MC00 is electrically coupled to the first input terminal A of the sense amplifier 51 via the transistor T20 and the memory cell MC01 is electrically coupled to the second input terminal B of the sense amplifier 51 via the transistor T10. That is, the connection of the input terminal of the sense amplifier 51 and the memory cells MC00, MC01 is interchanged by the transistors T10, T20.

Accordingly, the sense amplifier 51 in the second embodiment outputs two pieces of data corresponding to the sense amplifiers 51, 52 in the first embodiment. Two outputs from the sense amplifier 51 are input into the XOR circuit 61 via the buffers 81, 82 respectively. Then, the XOR circuit 61 performs an XOR operation on two outputs from the sense amplifier 51 and outputs data in accordance with the operation result. The output of the XOR circuit 61 becomes the final read data by the read circuit 41.

[Timing Chart of Reading in the Second Embodiment]

Hereinafter, the timing chart of reading by the read circuits will be described blow using FIGS. 13, 14, 15, 16, and 17.

Figure 13:
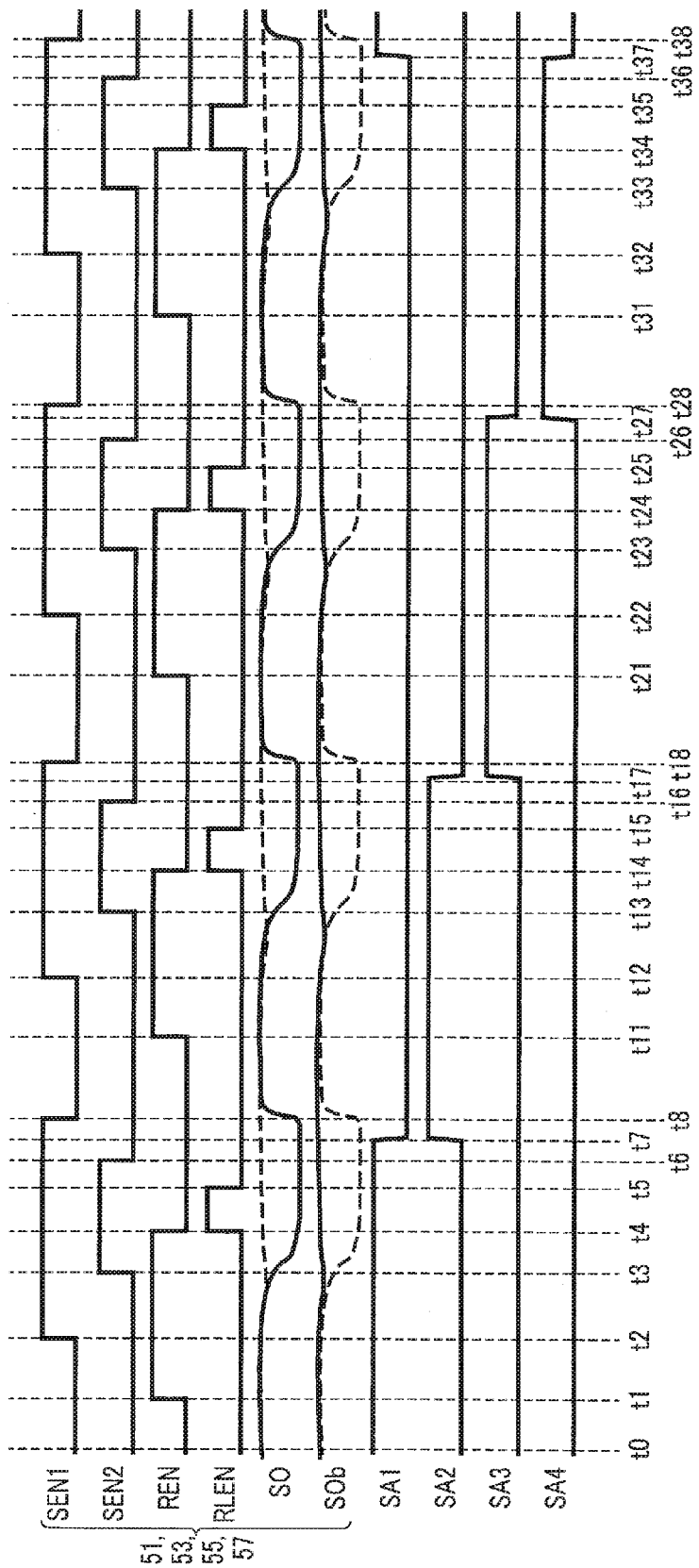
FIG. 13 is a timing chart of various voltage levels during reading in the semiconductor memory device according to the second embodiment.
Figure 14:
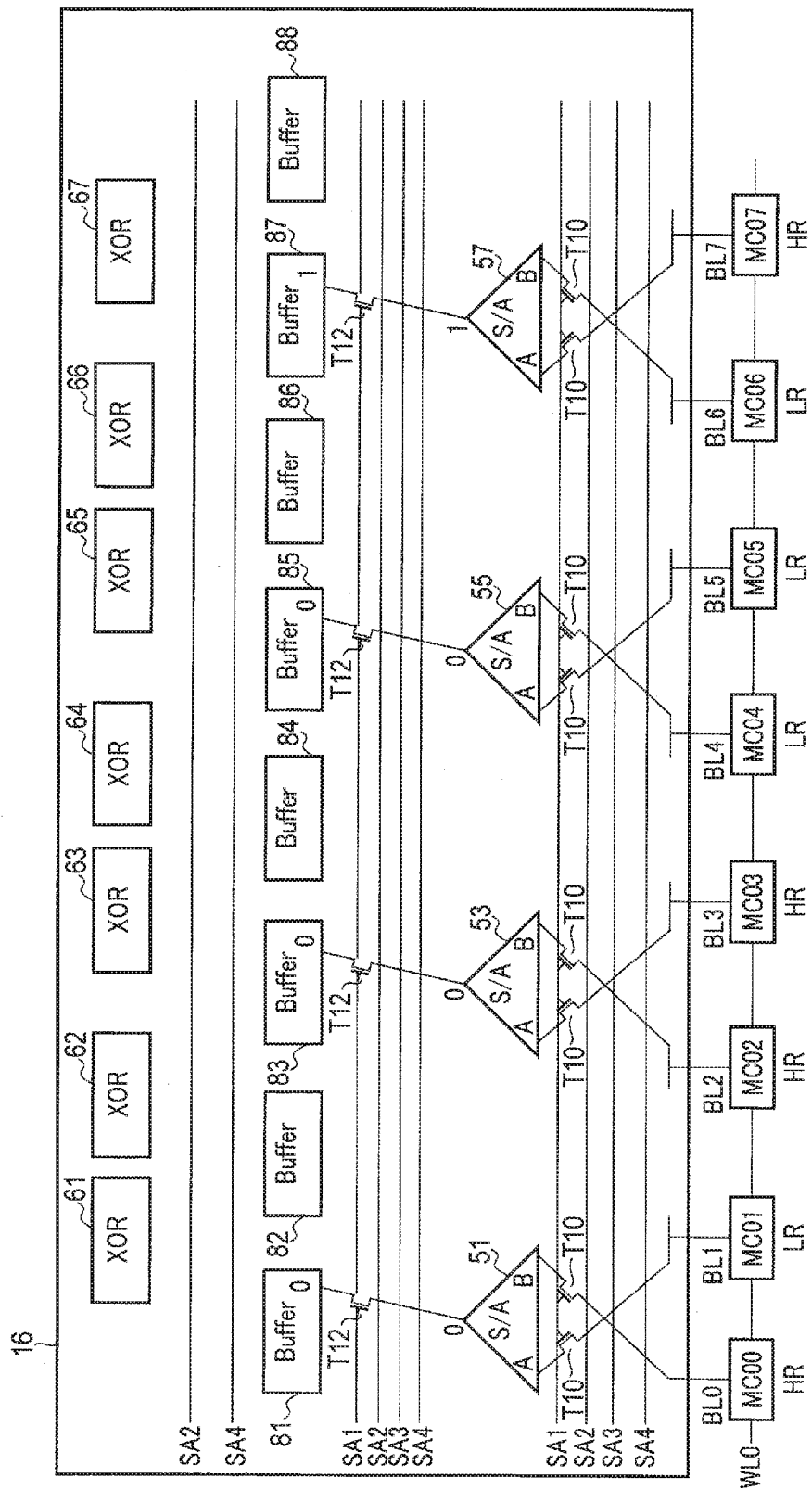
FIG. 14 is a diagram showing connection relations of the read/write circuit at times t0 to t7 in FIG. 13.
Figure 15:
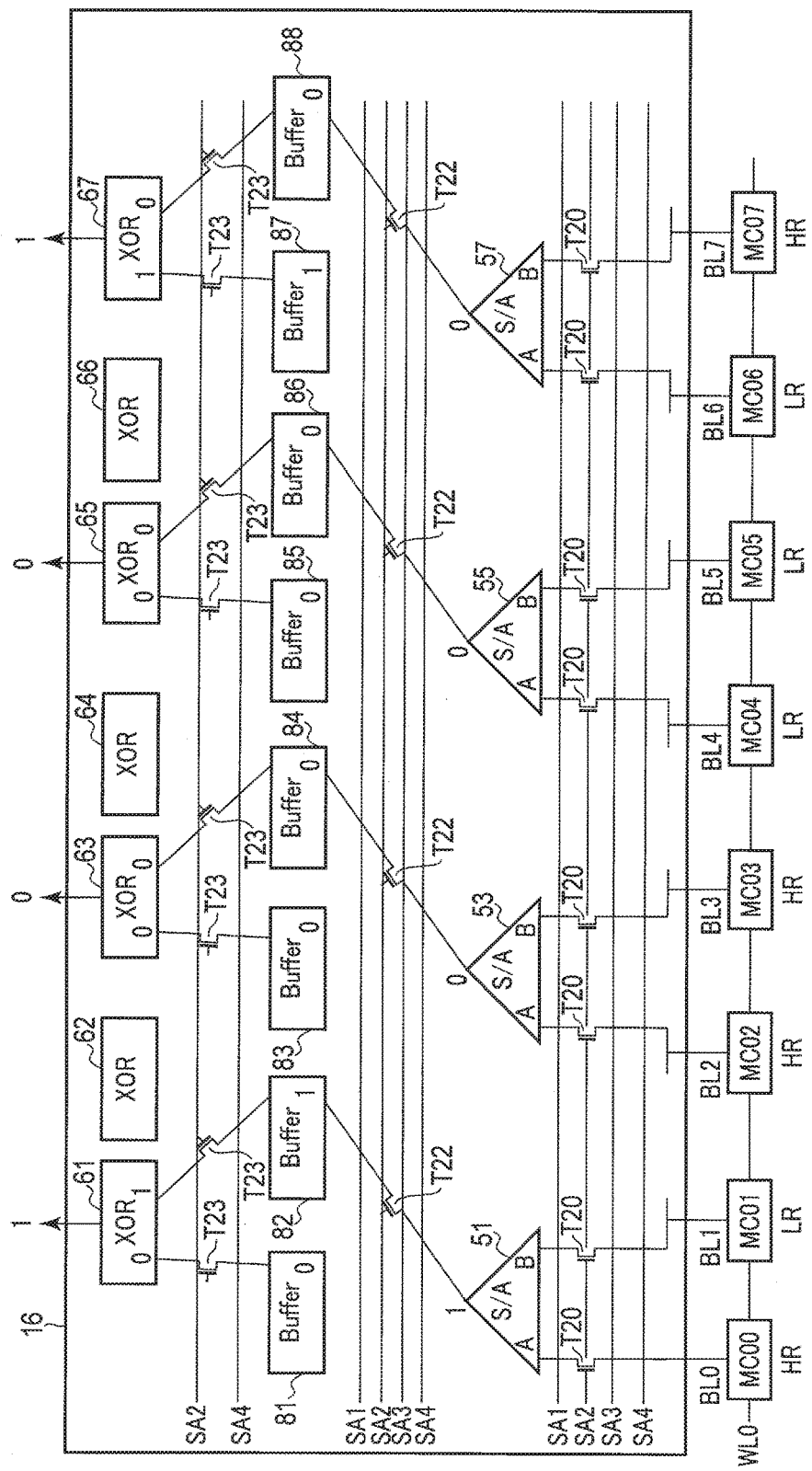
FIG. 15 is a diagram showing connection relations of the read/write circuit at times t7 to t17 in FIG. 13.
Figure 16:
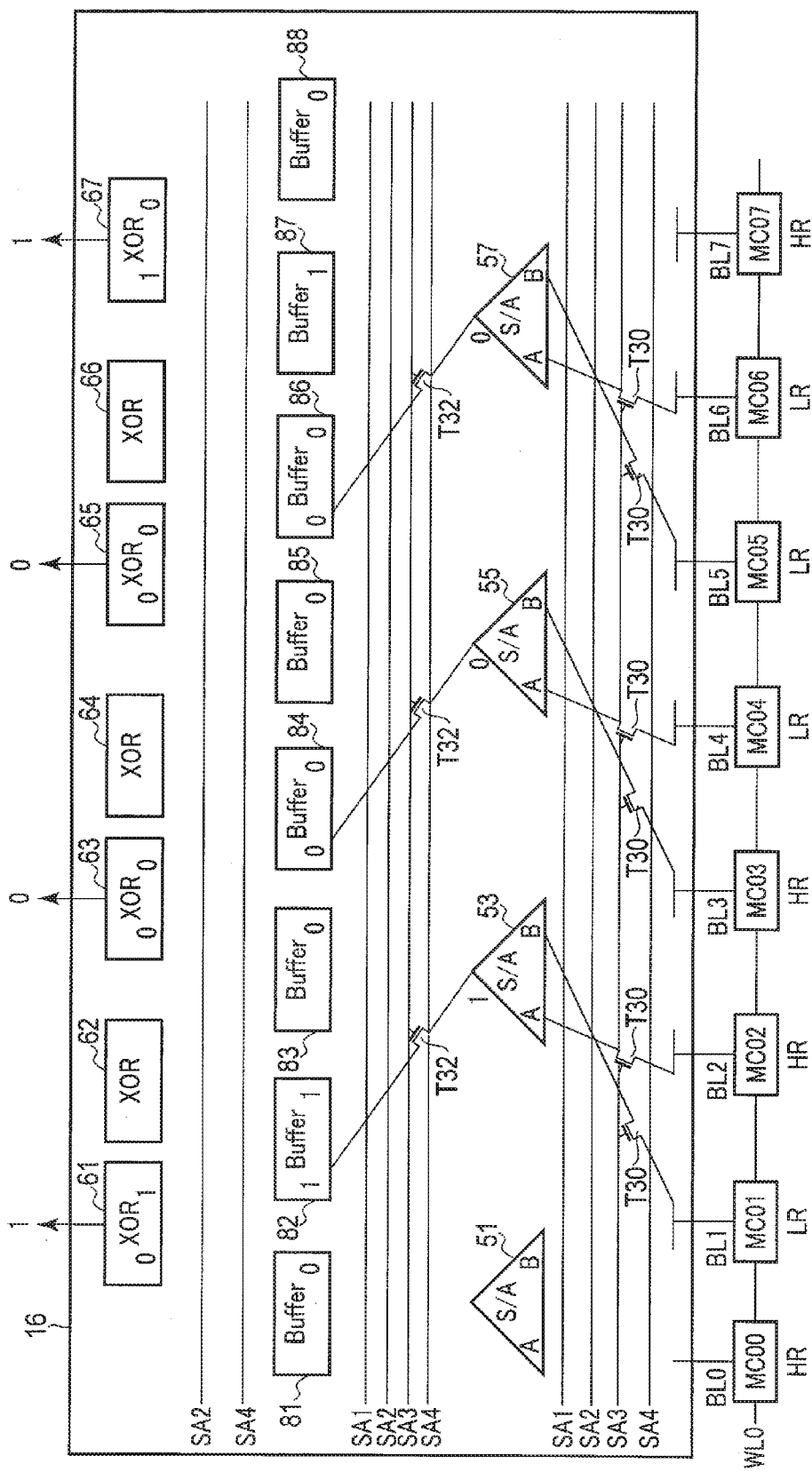
FIG. 16 is a diagram showing connection relations of the read/write circuit at times t17 to t27 in FIG. 13.

FIG. 13 shows a timing chart of various voltage levels during reading in the semiconductor memory device according to the second embodiment. FIG. 14 is a diagram showing connection relations of the read/write circuit 16 at times t0 to t7 in FIG. 13. FIG. 15 is a diagram showing connection relations of the read/write circuit 16 at times t7 to t17 in FIG. 13. FIG. 16 is a diagram showing connection relations of the read/write circuit 16 at times t17 to t27 in FIG. 13. FIG. 17 is a diagram showing connection relations of the read/write circuit 16 at times t27 to t37 in FIG. 13.

First, the first reading is performed at times t0 to t8. As shown in FIGS. 13 and 14, the control line SA1 is at the "H" level at time t0 and thus, the transistor T10 is turned on. Accordingly, the first input terminal A of the sense amplifier 51 and the memory cell MC01 are electrically coupled and the second input terminal B of the sense amplifier 51 and the memory cell MC00 are electrically coupled. Similarly, the first input terminal A of the sense amplifiers 53, 55, 57 and the memory cells MC03, MC05, MC07 are electrically coupled and the second input terminal B of the sense amplifiers 53, 55, 57 and the memory cells MC02, MC04, MC06 are electrically coupled.

Then, when, as shown in FIGS. 13 and 14, the signal RLEN changes to the "H" level at time t4, the sense amplifier 51 outputs "0" because the first input terminal A is of LR and the second input terminal B is of HR. Also, the sense amplifier 53 outputs "0" because the first input terminal A is of HR and the second input terminal B is of HR. The sense amplifier 55 outputs "0" because the first input terminal A is of LR and the second input terminal B is of LR. The sense amplifier 57 outputs "1" because the first input terminal A is of HR and the second input terminal B is of LR.

At this point, the control line SA1 is at the "H" level and thus, the transistor T12 is in an on state. Thus, the output "0" from the sense amplifier 51 is held in the buffer 81. Similarly, the outputs "0", "0", "1" from the sense amplifiers 53, 55, 57 are input into the buffers 83, 85, 87 respectively.

Then, the signal RLEN (RLENb) changes to the "L" ("H") level at time t5, the signal SEN2 changes to the "L" level at time t6, the control line SA1 changes to the "L" level at time t7, and the signal SEN1 changes to the "L" level at time t8. Accordingly, transistors to which these signals or the control line is supplied are turned off to complete the first reading.

Next, the second reading is performed at times t8 to t18. As shown in FIGS. 13 and 15, the control line SA2 is at the "H" level at time t8 and thus, the transistor T20 is turned on. Accordingly, the first input terminal A of the sense amplifier 51 and the memory cell MC00 are electrically coupled and the second input terminal B of the sense amplifier 51 and the memory cell MC01 are electrically coupled. Similarly, the first input terminal A of the sense amplifiers 53, 55, 57 and the memory cells MC02, MC04, MC06 are electrically coupled and the second input terminal B of the sense amplifiers 53, 55, 57 and the memory cells MC03, MC05, MC07 are electrically coupled.

Then, when, as shown in FIGS. 13 and 15, the signal RLEN changes to the "H" level at time t14, the sense amplifier 51 outputs "1" because the first input terminal A is of HR and the second input terminal B is of LR. Also, the sense amplifier 53 outputs "0" because the first input terminal A is of HR and the second input terminal B is of HR. The sense amplifier 55 outputs "0" because the first input terminal A is of LR and the second input terminal B is of LR. The sense amplifier 57 outputs "0" because the first input terminal A is of LR and the second input terminal B is of HR.

At this point, the control line SA2 is at the "H" level and thus, the transistor T22 is in an on state. Thus, the output "1" from the sense amplifier 51 is held in the buffer 82. Similarly, the outputs "0", "0", "0" from the sense amplifiers 53, 55, 57 are input into the buffers 84, 86, 88 respectively.

Further, the control line SA2 is at the "H" level and thus, the transistor T23 is in an on state. Thus, the output "0" from the buffer 81 and the output "1" from the buffer 82 are input into the XOR circuit 61. Similarly, the output "0" from the buffer 83 and the output "0" from the buffer 84 are input into the XOR circuit 63, the output "0" from the buffer 85 and the output "0" from the buffer 86 are input into the XOR circuit 65, and the output "1" from the buffer 87 and the output "0" from the buffer 88 are input into the XOR circuit 67.

The XOR circuit 61 performs an XOR operation of the output "0" from the buffer 81 and the output "1" from the buffer 82. Accordingly, the XOR circuit 61 outputs "1". Similarly, the XOR circuit 63 performs an XOR operation of the output "0" from the buffer 83 and the output "0" from the buffer 84 to output "0". Also, the XOR circuit 65 performs an XOR operation of the output "0" from the buffer 85 and the output "0" from the buffer 86 to output "0". Also, the XOR circuit 67 performs an XOR operation of the output "1" from the buffer 87 and the output "0" from the buffer 88 to output "1".

Then, the signal RLEN (RLENb) changes to the "L" ("H") level at time t15, the signal SEN2 changes to the "L" level at time t16, the control line SA1 changes to the "L" level at time t17, and the signal SEN1 changes to the "L" level at time t18. Accordingly, transistors to which these signals or the control line is supplied are turned off to complete the second reading.

In this manner, the resistance of the (2n−1)(n is an integer equal to 1 or greater)-th memory cell MC and that of the 2n-th memory cell are compared in the first reading and the second reading to read data in accordance with the comparison result.

Next, the third reading is performed at times t18 to t28. As shown in FIGS. 13 and 16, the control line SA1 is at the "H" level at time t0 and thus, the transistor T30 is turned on. Accordingly, the first input terminal A of the sense amplifier 53 and the memory cell MC02 are electrically coupled and the second input terminal B of the sense amplifier 53 and the memory cell MC01 are electrically coupled. Similarly, the first input terminal A of the sense amplifiers 55, 57 and the memory cells MC04, MC06 are electrically coupled and the second input terminal B of the sense amplifiers 55, 57 and the memory cells MC03, MC05 are electrically coupled.

Then, when, as shown in FIGS. 13 and 16, the signal RLEN changes to the "H" level at time t24, the sense amplifier 53 outputs "1" because the first input terminal A is of HR and the second input terminal B is of LR. Also, the sense amplifier 55 outputs "0" because the first input terminal A is of LR and the second input terminal B is of HR. The sense amplifier 57 outputs "0" because the first input terminal A is of LR and the second input terminal B is of LR.

At this point, the control line SA3 is at the "H" level and thus, the transistor T32 is in an on state. Thus, the output "1" from the sense amplifier 53 is held in the buffer 82. Similarly, the outputs "0", "0" from the sense amplifiers 55, 57 are input into the buffers 84, 86 respectively.

Then, the signal RLEN (RLENb) changes to the "L" ("H") level at time t25, the signal SEN2 changes to the "L" level at time t26, the control line SA1 changes to the "L" level at time t27, and the signal SEN1 changes to the "L" level at time t28. Accordingly, transistors to which these signals or the control line is supplied are turned off to complete the third reading.

Next, the fourth reading is performed at times t28 to t38. As shown in FIGS. 13 and 17, the control line SA4 is at the "H" level at time t28 and thus, the transistor T40 is turned on. Accordingly, the first input terminal A of the sense amplifier 53 and the memory cell MC01 are electrically coupled and the second input terminal B of the sense amplifier 53 and the memory cell MC02 are electrically coupled. Similarly, the first input terminal A of the sense amplifiers 55, 57 and the memory cells MC03, MC05 are electrically coupled and the second input terminal B of the sense amplifiers 55, 57 and the memory cells MC04, MC06 are electrically coupled.

Then, when, as shown in FIGS. 13 and 17, the signal RLEN changes to the "H" level at time t34, the sense amplifier 53 outputs "0" because the first input terminal A is of LR and the second input terminal B is of HR. Also, the sense amplifier 55 outputs "1" because the first input terminal A is of HR and the second input terminal B is of LR. The sense amplifier 57 outputs "0" because the first input terminal A is of LR and the second input terminal B is of LR.

At this point, the control line SA4 is at the "H" level and thus, the transistor T42 is in an on state. Thus, the output "1" from the sense amplifier 53 is held in the buffer 83. Similarly, the outputs "1", "0" from the sense amplifiers 55, 57 are input into the buffers 85, 87 respectively.

Further, the control line SA4 is at the "H" level and thus, the transistor T43 is in an on state. Thus, the output "1" from the buffer 82 and the output "0" from the buffer 83 are input into the XOR circuit 62. Similarly, the output "0" from the buffer 84 and the output "1" from the buffer 85 are input into the XOR circuit 64 and the output "0" from the buffer 86 and the output "0" from the buffer 87 are input into the XOR circuit 66.

The XOR circuit 62 performs an XOR operation of the output "1" from the buffer 82 and the output "0" from the buffer 83. Accordingly, the XOR circuit 62 outputs "1". Similarly, the XOR circuit 64 performs an XOR operation of the output "0" from the buffer 84 and the output "1" from the buffer 85 to output "1". Also, the XOR circuit 66 performs an XOR operation of the output "0" from the buffer 86 and the output "0" from the buffer 87 to output "0".

Then, the signal RLEN (RLENb) changes to the "L" ("H") level at time t35, the signal SEN2 changes to the "L" level at time t36, the control line SA1 changes to the "L" level at time t37, and the signal SEN1 changes to the "L" level at time t38. Accordingly, transistors to which these signals or the control line is supplied are turned off to complete the fourth reading.

In this manner, the resistance of the (2n−1)(n is an integer equal to 1 or greater)-th memory cell MC and that of the 2n-th memory cell are compared in the third reading and the fourth reading to read data in accordance with the comparison result.

Effects of the Second Embodiment

According to the second embodiment, each read circuit includes a sense amplifier and with this configuration, compares resistances of two memory cells to read data in accordance with the comparison result. That is, the same operation as in the first embodiment can be performed while the number of sense amplifiers is less than in the first embodiment. Accordingly, when compared with the first embodiment, the chip area can be reduced in the second embodiment.

Modification of the Second Embodiment

Figure 18:
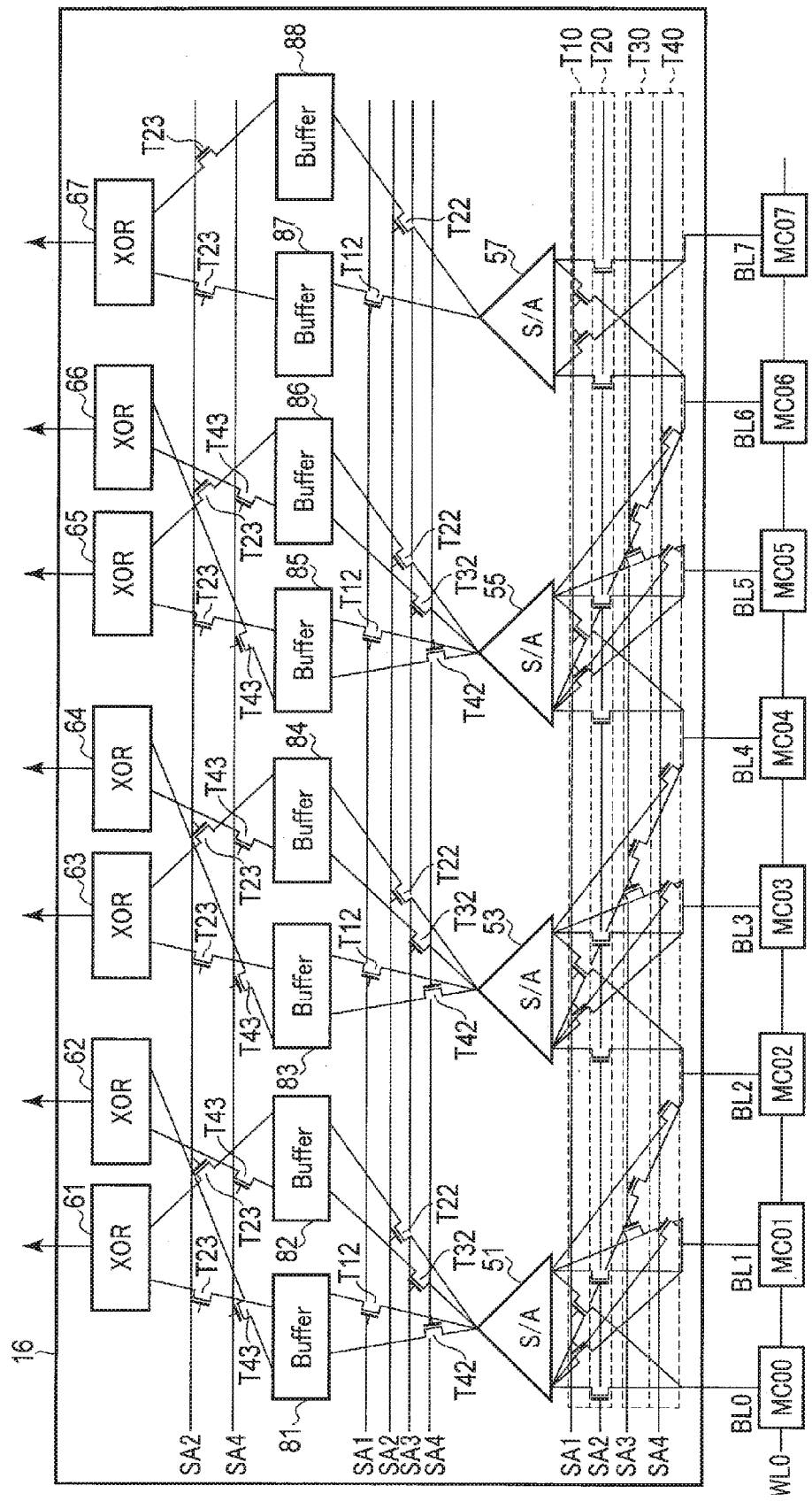
FIG. 18 is a block diagram showing a modification of the read/write circuit in the semiconductor memory device according to the second embodiment and a diagram showing the read circuit in more detail.

FIG. 18 is a block diagram showing a modification of the read/write circuit 16 in the semiconductor memory device according to the second embodiment and a block diagram showing the read circuits 41-47 in more detail.

As shown in FIG. 18, a read/write circuit 16 according to the modification includes sense amplifiers 51, 53, 55, 57, XOR circuits 61-67, transistors T10, T20, T30, T40, T12, T22, T32, T42, T23, T43, and buffers 81-88.

The modification is different from the second embodiment in each connection relation of memory cells MC00-07, the sense amplifiers 51, 53, 55, 57, the XOR circuits 61-67, and the buffers 81-88.

Here, the sense amplifier 51, the XOR circuit 61, and the buffers 81, 82 correspond to a read circuit 41, the sense amplifier 51, the XOR circuit 62, and the buffers 81, 82 correspond to a read circuit 42, and the sense amplifier 53, the XOR circuit 63, and the buffers 83, 84 correspond to a read circuit 43. Similarly, the sense amplifier 53, the XOR circuit 64, and the buffers 83, 84 correspond to a read circuit 44, the sense amplifier 55, the XOR circuit 65, and the buffers 85, 86 correspond to a read circuit 45, the sense amplifier 55, the XOR circuit 66, and the buffers 85, 86 correspond to a read circuit 46, and the sense amplifier 57, the XOR circuit 67, and the buffers 87, 88 correspond to a read circuit 47.

A first input terminal A of the sense amplifier 51 is electrically coupled to the memory cell MC01 via the transistor T10, electrically coupled to the memory cell MC00 via the transistor T20, electrically coupled to the memory cell MC02 via the transistor T30, and electrically coupled to the memory cell MC01 via the transistor T40. A second input terminal B of the sense amplifier 51 is electrically coupled to the memory cell MC00 via the transistor T10, further electrically coupled to the memory cell MC01 via the transistor T20, electrically coupled to the memory cell MC01 via the transistor T30, and electrically coupled to the memory cell MC02 via the transistor T40.

An output terminal of the sense amplifier 51 is electrically coupled to the XOR circuit 61 via the transistor T12, the buffer 81, and the transistor T23 and further electrically coupled to the XOR circuit 61 via the transistor T22, the buffer 82, and the transistor T23. Also, the output terminal of the sense amplifier 51 is electrically coupled to the XOR circuit 62 via the transistor T32, the buffer 82, and the transistor T43 and further electrically coupled to the XOR circuit 62 via the transistor T42, the buffer 81, and the transistor T43.

The first input terminal A of the sense amplifier 53 is electrically coupled to the memory cell MC03 via the transistor T10, electrically coupled to the memory cell MC02 via the transistor T20, electrically coupled to the memory cell MC04 via the transistor T30, and electrically coupled to the memory cell MC03 via the transistor T40. The second input terminal B of the sense amplifier 53 is electrically coupled to the memory cell MC02 via the transistor T10, further electrically coupled to the memory cell MC03 via the transistor T20, electrically coupled to the memory cell MC03 via the transistor T30, and electrically coupled to the memory cell MC04 via the transistor T40.

The output terminal of the sense amplifier 53 is electrically coupled to the XOR circuit 63 via the transistor T12, the buffer 83, and the transistor T23 and further coupled to the XOR circuit 63 via the transistor T22, the buffer 84, and the transistor T23. Also, the output terminal of the sense amplifier 53 is electrically coupled to the XOR circuit 64 via the transistor T32, the buffer 84, and the transistor T43 and further electrically coupled to the XOR circuit 64 via the transistor T42, the buffer 82, and the transistor T43.

The first input terminal A of the sense amplifier 55 is electrically coupled to the memory cell MC05 via the transistor T10, electrically coupled to the memory cell MC04 via the transistor T20, electrically coupled to the memory cell MC06 via the transistor T30, and electrically coupled to the memory cell MC05 via the transistor T40. The second input terminal B of the sense amplifier 55 is electrically coupled to the memory cell MC04 via the transistor T10, electrically coupled to the memory cell MC05 via the transistor T20, electrically coupled to the memory cell MC05 via the transistor T30, and electrically coupled to the memory cell MC06 via the transistor T40.

The output terminal of the sense amplifier 55 is electrically coupled to the XOR circuit 65 via the transistor T12, the buffer 85, and the transistor T23 and further electrically coupled to the XOR circuit 65 via the transistor T22, the buffer 86, and the transistor T23. Also, the output terminal of the sense amplifier 55 is electrically coupled to the XOR circuit 66 via the transistor T32, the buffer 86, and the transistor T43 and further electrically coupled to the XOR circuit 66 via the transistor T42, the buffer 85, and the transistor T43.

The first input terminal A of the sense amplifier 57 is electrically coupled to the memory cell MC07 via the transistor T10 and electrically coupled to the memory cell MC06 via the transistor T20. The second input terminal B of the sense amplifier 57 is electrically coupled to the memory cell MC06 via the transistor T10 and electrically coupled to the memory cell MC07 via the transistor T20.

The output terminal of the sense amplifier 57 is electrically coupled to the XOR circuit 67 via the transistor T12, the buffer 87, and the transistor T23 and further electrically coupled to the XOR circuit 67 via the transistor T22, the buffer 88, and the transistor T23.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
    first to fourth memory cells, each of which is configured to have one of a first resistance state and a second resistance state; and
    a first circuit configured to:
    output first data by comparing a first signal and a second signal, the first signal representing a resistance state of the first memory cell and the second signal representing a resistance state of the second memory cell,
    output second data by comparing the second signal and a third signal, the third signal representing a resistance state of the third memory cell, and
    output third data by comparing the third signal and a fourth signal, the fourth signal representing a resistance state of the fourth memory cell.

2. The device of claim 1, wherein the first circuit is further configured to:
    output the first data as a first logical value when the first memory cell has the first resistance state and the second memory cell has the first resistance state, or the first memory cell has the second resistance state and the second memory cell has the second resistance state and
    output the first data as a second logical value when the first memory cell has the first resistance state and the second memory cell has the second resistance state, or the first memory cell has the second resistance state and the second memory cell has the first resistance state.

3. The device of claim 1, wherein the first circuit comprises:
    first and second sense amplifiers, each of which having first and second input terminals,
    a first transistor which electrically couples the first memory cell and the second input terminal of the first sense amplifier,
    a second transistor which electrically couples the second memory cell and the first input terminal of the first sense amplifier,
    a third transistor which electrically couples the first memory cell and the first input terminal of the second sense amplifier, and
    a fourth transistor which electrically couples the second memory cell and the second input terminal of the second sense amplifier.

4. The device of claim 3, wherein a gate of the first transistor and a gate of the second transistor are electrically coupled to a first control line.

5. The device of claim 3, wherein a gate of the third transistor and a gate of the fourth transistor are electrically coupled to a second control line.

6. The device of claim 3, wherein:
    a gate of the first transistor and a gate of the second transistor are electrically coupled to a first control line,
    a gate of the third transistor and a gate of the fourth transistor are electrically coupled to a second control line, and
    the first circuit applies a first voltage to the second control line after applying the first voltage to the first control line during reading.

7. The device of claim 3, wherein:
    the first sense amplifier comprises:
    a fifth transistor having a first terminal electrically coupled to the first input terminal of the first sense amplifier; and
    a sixth transistor having a first terminal electrically coupled to the second input terminal of the first sense amplifier, and
    a gate length of the fifth transistor and a gate length of the sixth transistor are different.

8. The device of claim 3, wherein:
    the first sense amplifier comprises:
    a fifth transistor having a first terminal electrically coupled to the first input terminal of the first sense amplifier; and
    a sixth transistor having a first terminal electrically coupled to the second input terminal of the first sense amplifier, and
    an impurity concentration of a channel of the fifth transistor and an impurity concentration of a channel of the sixth transistor are different.

9. The device of claim 3, wherein:
    the first sense amplifier comprises:
    a fifth transistor having a first terminal electrically coupled to the first input terminal of the first sense amplifier; and
    a sixth transistor having a first terminal electrically coupled to the second input terminal of the first sense amplifier, and
    a second voltage is applied to a gate of the fifth transistor and a third voltage is applied to a gate of the sixth transistor during reading.

10. The device of claim 3, wherein the first circuit further comprises an XOR circuit including a first input terminal electrically coupled to an output terminal of the first sense amplifier and a second input terminal electrically coupled to an output terminal of the second sense amplifier.

11. A semiconductor memory device comprising:
    first and second memory cells, each of which is configured to have one of a first resistance state and a second resistance state; and
    a first circuit configured to:
    output a first data as a first logical value by comparing a resistance state of the first memory cell and a resistance state of the second memory cell when the first memory cell has the first resistance state and the second memory cell has the first resistance state, or the first memory cell has second resistance state and the second memory cell has the second resistance state, and
    output the first data as a second logical value by comparing the resistance state of the first memory cell and the resistance state of the second memory cell when the first memory cell has the first resistance state and the second memory cell has the second resistance state, or the first memory cell has the second resistance state and the second memory cell has the first resistance state.

12. The device of claim 11, wherein the first circuit comprises:
   first and second sense amplifiers, each of which having first and second input terminals,
   a first transistor that electrically couples the first memory cell and the second input terminal of the first sense amplifier,
   a second transistor that electrically couples the second memory cell and the first input terminal of the first sense amplifier,
   a third transistor that electrically couples the first memory cell and the first input terminal of the second sense amplifier, and
   a fourth transistor that electrically couples the second memory cell and the second input terminal of the second sense amplifier.

13. The device of claim 12, wherein a gate of the first transistor and a gate of the second transistor are electrically coupled to a first control line.

14. The device of claim 12, wherein a gate of the third transistor and a gate of the fourth transistor are electrically coupled to a second control line.

15. The device of claim 12, wherein:
   a gate of the first transistor and a gate of the second transistor are electrically coupled to a first control line,
   a gate of the third transistor and a gate of the fourth transistor are electrically coupled to a second control line, and
   the first circuit applies a first voltage to the second control line after applying the first voltage to the first control line during reading.

16. The device of claim 12, wherein:
   the first sense amplifier comprises:
      a fifth transistor having a first terminal electrically coupled to the first input terminal of the first sense amplifier; and
      a sixth transistor having a first terminal electrically coupled to the second input terminal of the first sense amplifier, and
   a gate length of the fifth transistor and a gate length of the sixth transistor are different.

17. The device of claim 12, wherein:
   the first sense amplifier comprises:
      a fifth transistor having a first terminal electrically coupled to the first input terminal of the first sense amplifier; and
      a sixth transistor having a first terminal electrically coupled to the second input terminal of the first sense amplifier, and
   an impurity concentration of a channel of the fifth transistor and an impurity concentration of a channel of the sixth transistor are different.

18. The device of claim 12, wherein:
   the first sense amplifier comprises:
      a fifth transistor having a first terminal electrically coupled to the first input terminal of the first sense amplifier; and
      a sixth transistor having a first terminal electrically coupled to the second input terminal of the first sense amplifier, and
   a second voltage is applied to a gate of the fifth transistor and a third voltage is applied to a gate of the sixth transistor during reading.

19. The device of claim 12, wherein the first circuit further comprises an XOR circuit including a first input terminal electrically coupled to an output terminal of the first sense amplifier and a second input terminal electrically coupled to an output terminal of the second sense amplifier.

20. A semiconductor memory device comprising:
   first and second memory cells whose resistance state is variable;
   first and second sense amplifiers, each of which having first and second input terminals;
   a first transistor that electrically couples the first memory cell and the second input terminal of the first sense amplifier;
   a second transistor that electrically couples the second memory cell and the first input terminal of the first sense amplifier;
   a third transistor that electrically couples the first memory cell and the first input terminal of the second sense amplifier; and
   a fourth transistor that electrically couples the second memory cell and the second input terminal of the second sense amplifier.

* * * * *